(12) United States Patent
Hirakata

(10) Patent No.: US 8,283,724 B2
(45) Date of Patent: Oct. 9, 2012

(54) MEMORY ELEMENT AND SEMICONDUCTOR DEVICE, AND METHOD FOR MANUFACTURING THE SAME

(75) Inventor: Yoshiharu Hirakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 495 days.

(21) Appl. No.: 12/034,334

(22) Filed: Feb. 20, 2008

(65) Prior Publication Data

US 2008/0205132 A1 Aug. 28, 2008

(30) Foreign Application Priority Data

Feb. 26, 2007 (JP) ................. 2007-045558

(51) Int. Cl.
*H01L 27/12* (2006.01)
(52) U.S. Cl. ............... 257/350; 257/E21.477; 438/593
(58) Field of Classification Search ........... 257/E21.477, 257/350, E27.103, E21.645–E21.658; 438/593
See application file for complete search history.

(56) References Cited

U.S. PATENT DOCUMENTS

| | | | |
|---|---|---|---|
| 5,583,819 A | 12/1996 | Roesner et al. | |
| 5,742,129 A | 4/1998 | Nagayama et al. | |
| 5,853,905 A | 12/1998 | So et al. | |
| 5,977,562 A | 11/1999 | Hirakata et al. | |
| 6,051,851 A | 4/2000 | Ohmi et al. | |
| 6,054,809 A | 4/2000 | Haynes et al. | |
| 6,246,179 B1 | 6/2001 | Yamada | |
| 6,268,617 B1 | 7/2001 | Hirakata et al. | |
| 6,307,528 B1 | 10/2001 | Yap | |
| 6,312,983 B1 | 11/2001 | Wu et al. | |
| 6,380,687 B1 | 4/2002 | Yamazaki | |
| 6,512,271 B1 | 1/2003 | Yamazaki et al. | |
| 6,528,815 B1 | 3/2003 | Brown et al. | |
| 6,534,841 B1 | 3/2003 | Van Brocklin et al. | |
| 6,569,544 B1 | 5/2003 | Alain et al. | |
| 6,584,029 B2 | 6/2003 | Tran et al. | |
| 6,603,140 B2 | 8/2003 | Kobori et al. | |
| 6,833,560 B2 | 12/2004 | Konuma et al. | |
| 6,950,331 B2 | 9/2005 | Yang et al. | |
| 7,015,504 B2 | 3/2006 | Lyons et al. | |
| 7,019,457 B2 | 3/2006 | Fukunaga | |
| 7,405,167 B2 | 7/2008 | Kang et al. | |
| 7,499,305 B2 | 3/2009 | Nomura et al. | |
| 7,622,736 B2 | 11/2009 | Moriya et al. | |

(Continued)

FOREIGN PATENT DOCUMENTS

JP 1-259564 10/1989

(Continued)

*Primary Examiner* — Julio J Maldonado
*Assistant Examiner* — Sonya McCall Shepard
(74) *Attorney, Agent, or Firm* — Husch Blackwell LLP

(57) ABSTRACT

It is an object to solve inhibition of miniaturization of an element and complexity of a manufacturing process thereof. It is another object to provide a nonvolatile memory device and a semiconductor device having the memory device, in which data can be additionally written at a time besides the manufacturing time and in which forgery caused by rewriting of data can be prevented. It is further another object to provide an inexpensive nonvolatile memory device and semiconductor device. A memory element is manufactured in which a first conductive layer, a second conductive layer that is beside the first conductive layer, and conductive fine particles of each surface which is covered with an organic film are deposited over an insulating film. The conductive fine particles are deposited between the first conductive layer and the second conductive layer.

16 Claims, 12 Drawing Sheets

U.S. PATENT DOCUMENTS

| | | |
|---|---|---|
| 7,630,233 B2 | 12/2009 | Kato et al. |
| 7,688,624 B2 | 3/2010 | Abe et al. |
| 7,781,758 B2 | 8/2010 | Abe et al. |
| 7,781,862 B2 | 8/2010 | Bertin et al. |
| 7,793,848 B2 | 9/2010 | Abe et al. |
| 7,816,721 B2 | 10/2010 | Yamazaki et al. |
| 2001/0049030 A1 | 12/2001 | Okada et al. |
| 2002/0163828 A1 | 11/2002 | Krieger et al. |
| 2004/0056251 A1 | 3/2004 | Kim et al. |
| 2004/0067659 A1 | 4/2004 | Black et al. |
| 2004/0164363 A1 | 8/2004 | Black et al. |
| 2004/0166306 A1 | 8/2004 | Black et al. |
| 2004/0238864 A1 | 12/2004 | Tripsas et al. |
| 2005/0006640 A1 | 1/2005 | Jackson et al. |
| 2005/0022374 A1 | 2/2005 | Hirai et al. |
| 2005/0029522 A1 | 2/2005 | Konuma et al. |
| 2005/0045933 A1 | 3/2005 | Kimura et al. |
| 2005/0095356 A1 | 5/2005 | Nakamura et al. |
| 2005/0099878 A1 | 5/2005 | Andideh et al. |
| 2005/0189520 A1 | 9/2005 | Okada et al. |
| 2005/0270822 A1 | 12/2005 | Shrivastava et al. |
| 2006/0028895 A1 | 2/2006 | Taussig et al. |
| 2006/0046336 A1 | 3/2006 | Shoji et al. |
| 2006/0097250 A1 | 5/2006 | Koyama et al. |
| 2006/0131569 A1 | 6/2006 | Choi et al. |
| 2006/0157772 A1 | 7/2006 | Sumida et al. |
| 2006/0158482 A1 | 7/2006 | Nakamura et al. |
| 2006/0208248 A1 | 9/2006 | Lee et al. |
| 2006/0221672 A1 | 10/2006 | Drndic et al. |
| 2006/0246269 A1* | 11/2006 | Yukawa .................. 428/209 |
| 2006/0257637 A1 | 11/2006 | Pereira et al. |
| 2006/0267068 A1 | 11/2006 | Sato et al. |
| 2007/0001167 A1 | 1/2007 | Nomura |
| 2007/0034878 A1 | 2/2007 | Kato et al. |
| 2007/0051952 A1 | 3/2007 | Yamazaki et al. |
| 2007/0051958 A1 | 3/2007 | Yamazaki et al. |
| 2007/0262318 A1 | 11/2007 | Shoji et al. |
| 2008/0042128 A1 | 2/2008 | Furukawa et al. |
| 2008/0164464 A1 | 7/2008 | Kato |
| 2008/0210928 A1 | 9/2008 | Abe et al. |
| 2008/0283616 A1 | 11/2008 | Yukawa et al. |
| 2008/0296561 A1 | 12/2008 | Nomura et al. |
| 2009/0102055 A1* | 4/2009 | Aoki et al. .................. 257/773 |
| 2009/0121874 A1 | 5/2009 | Nomura et al. |
| 2010/0055896 A1 | 3/2010 | Abe et al. |
| 2010/0072286 A1 | 3/2010 | Kato et al. |
| 2010/0283024 A1 | 11/2010 | Yoshizumi |
| 2010/0295034 A1 | 11/2010 | Abe et al. |
| 2011/0031469 A1 | 2/2011 | Yamazaki et al. |
| 2011/0045660 A1 | 2/2011 | Romano et al. |

FOREIGN PATENT DOCUMENTS

| | | |
|---|---|---|
| JP | 5-202356 | 8/1993 |
| JP | 11-504749 | 4/1999 |
| JP | 2001-237380 | 8/2001 |
| JP | 2002-26277 | 1/2002 |
| JP | 2005-116682 | 4/2005 |
| JP | 2005-247905 | 9/2005 |
| JP | 2006-186363 | 7/2006 |
| JP | 2006-237593 | 9/2006 |
| JP | 2007013943 A * | 1/2007 |
| WO | WO 2004/015778 A1 | 2/2004 |
| WO | WO 2005/096380 A1 | 10/2005 |
| WO | WO 2006/043573 A1 | 4/2006 |
| WO | WO 2006/043611 A1 | 4/2006 |
| WO | WO 2006/043687 A1 | 4/2006 |
| WO | WO 2006/051996 A1 | 5/2006 |
| WO | WO 2006/057417 A1 | 6/2006 |
| WO | WO 2006/059554 A1 | 6/2006 |
| WO | WO 2006/059746 A1 | 6/2006 |
| WO | WO 2006/062143 A1 | 6/2006 |
| WO | WO 2006/062175 A1 | 6/2006 |
| WO | WO 2006/064859 A1 | 6/2006 |
| WO | WO 2006/080550 A1 | 8/2006 |

* cited by examiner

MEMORY ELEMENT AND SEMICONDUCTOR DEVICE, AND METHOD FOR MANUFACTURING THE SAME

BACKGROUND OF THE INVENTION

1. Field of the Invention

The present invention relates to a semiconductor device that has a circuit including a memory element and a method for manufacturing the semiconductor device.

Note that a semiconductor device in this specification refers to all types of devices which can function by utilizing semiconductor characteristics, and electro-optic devices, semiconductor circuits, and electronic devices are all included in the semiconductor device.

2. Description of the Related Art

A memory element using an organic compound generally has a structure in which two electrodes are provided above and below an organic compound layer, as two terminals of the memory element as described in Reference 1: United State Patent Application Laid-Open 2005/6640.

In Reference 2: Japanese Translation of PCT International Application No. H11-504749, a memory element is proposed, having a structure in which a pair of electrodes is formed over a same surface, as two terminals of the memory element, and a conjugated polymer or an oligomer are deposited thereover. In the memory element, resistance of the conjugated polymer or oligomer is reduced by applying voltage between the electrodes, so that information is written.

SUMMARY OF THE INVENTION

As a memory circuit provided in the semiconductor device, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, or the like can be given. Among them, a DRAM and an SRAM are volatile memory circuits in which data are erased when power is turned off; therefore, it is necessary to write data every time the power is turned on. An FeRAM is a nonvolatile memory circuit in which a capacitor including a ferroelectric layer is used, and the number of manufacturing steps thereof is increased. A mask ROM has a simple structure; however, it is necessary to write data during manufacturing steps thereof, and data cannot be additionally written. An EPROM, an EEPROM, and a flash memory are nonvolatile memory circuits, and an element having two gate electrodes is used therein: therefore, there are problems in that the number of manufacturing steps thereof is increased.

In a memory circuit using a general organic compound, a memory element is formed by providing an organic compound between a pair of upper and lower electrodes. When the electrode is formed over an organic layer, temperature is limited because the organic layer can be influenced by temperature in forming the electrode. A forming method of the electrode is limited due to this limitation of temperature, and an expected electrode cannot be formed. Therefore, there are problems in that miniaturization of an element is inhibited. A problem caused by an electrode formed over an organic layer is required to be solved from an aspect of inhibition of element miniaturization.

In addition, in a case of a memory element described in Reference 1 in which a pair of electrodes as two terminals is formed above and below an organic layer, a plurality of steps are required to form a pair of electrodes because the electrodes are each provided above and below the organic layer. Therefore, there is a problem in that a manufacturing process becomes complicated. The complicated manufacturing process is a problem that is required to be solved from an aspect of a manufacturing cost.

In the memory element described in Reference 2, a writing voltage value is high, and typical writing is performed with voltage of 100V in one second. In addition, in the memory element described in Reference 2, writing is also performed with voltage of 10V in ten seconds. Reference 2 describes that an interval between the electrodes is 5 µm or 10 µm and a thickness of the conjugated polymer or the oligomer is about 30 nm to 10 µm. A layer of the memory element in Reference 2 does not vary morphologically like crystal before and after application of voltage. As a result of variation of conductivity before and after application of voltage, the layer is not damaged. Reference 2 describes that variation of conductivity before and after application of voltage does not cause a loss of materials.

In a case where the memory element is considered to be mounted in portable information terminals and small pieces such as a chip, it is preferable to perform writing and reading data to/from the memory element with limited power, and it is an object to reduce power consumption that is needed for writing and reading data to/from the memory element.

In view of foregoing problems, it is an object of the present invention to solve inhibition of miniaturization of elements and complexity of a manufacturing process. It is another object to provide a nonvolatile memory device and a semiconductor device having the memory device, in which data can be additionally written at a time besides the manufacturing time and in which forgery caused by rewriting of data can be prevented. It is further another object to provide an inexpensive nonvolatile memory device and semiconductor device.

In view of the above object, a feature of this specification is a memory element which includes a first conductive layer formed over a first region of an insulating surface, a second conductive layer formed over a second region of the insulating surface, and a conductive particle deposited between the first conductive layer and the second conductive layer, the conductive particle having a surface covered with an organic film. The first region is apart from the second region. The first and second conductive layers are electrically connectable to each other at least through the conductive particle as a result of a writing operation in the memory element. The first conductive layer and the second conductive layer are in direct contact with the insulating surface. The present invention is to solve at least one of the above objects. Further, a memory element may comprise an insulating film between the insulating surface and the second conductive layer while the first conductive layer is in direct contact with the insulating surface. And a feature of this specification is a memory element which includes a first conductive layer formed over an insulating surface, an insulating film formed over the insulating surface and over a part of the first conductive layer to expose a portion of the first conductive layer, a second conductive layer formed over the insulating film, where the second conductive layer partly overlaps the first conductive layer with the insulating film interposed therebetween, and a conductive particle deposited on the exposed portion of the first conductive layer. The first and second conductive layers are electrically connectable to each other at least through the conductive particle as a result of a writing operation in the memory element.

The conductive fine particle in this specification indicates a conductive material with a grain size, in other words, a maximum diameter in a cross section of a grain, of 5 to 30 nm. For example, the conductive fine particle indicates a noble metal nanoparticle such as Ag, Au, or Pt, a nanoparticle such as Mn, Co, Fe, Ni, Ti, Cr, Cu, Sn, Zn, In, Sb, Te, Bi, Pd, or Ge, a nitride nanoparticle such as titanium nitride, an oxide nanoparticle such as molybdenum oxide, indium oxide, or tin oxide, or a conductive ceramic particle such as ITO or ZnO. As the conductive fine particle, a nanoparticle including an alloy can be used: for example, a nanoparticle including iron such as a Fe—Co nanoparticle, a Fe—Si nanoparticle, a Fe—Ni nanoparticle, or a Fe—Pd nanoparticle; a nanoparticle including gold such as an Au—Ge nanoparticle, an Au—Sn nanoparticle, or an Au—Pd nanoparticle; a nanoparticle including silver such as an Ag—Ni nanoparticle or an Ag—In nanoparticle; a nanoparticle including copper such as a Cu—Si nanoparticle or a Cu—Sn nanoparticle; a nanoparticle including cobalt such as a Co—Ni nanoparticle or a Co—Pd nanoparticle; a nanoparticle including chromium such as a Cr—Ni nanoparticle; or a nanoparticle including nickel such as a Ni—Pd nanoparticle.

The conductive fine particles deposited between the first conductive layer and the second conductive layer may be conductive fine particles with different grain sizes, which are formed of a same material. Alternatively, the conductive fine particles deposited between the first conductive layer and the second conductive layer may be mixed with conductive fine particles of different kinds of materials. Note that in this specification, the grain size indicates the length of a diameter; however, a particle shape of the conductive fine particles deposited between the first conductive layer and the second conductive layer is not limited to a sphere shape. The particle shape in a cross section may be an ellipse shape or a complicated polygonal shape. Accordingly, in a case where the cross section of the particle is not a circular shape or an ellipse shape, the grain size means a maximum length in a cross-sectional shape. Further, the conductive fine particles are referred to be conductive nanoparticles.

Further, the surface of each conductive fine particle is covered with a thin organic film so as to prevent the conductive fine particles from being agglutinated in a solution which causes nonuniform density. The thickness of the organic film is made to be smaller than the grain size of the conductive fine particles. By using the solution containing the conductive fine particles, a layer containing the conductive fine particles can be formed by a coating method (such as a spin coating method, an inkjet method, a dipping method, a bar code method, or a spray method), typically using an inkjet device with a narrow nozzle, so that the layer containing the conductive fine particles can be selectively deposited with high position precision.

The conductive fine particle covered with the organic film has comparatively high electrical resistivity. This organic film can be removed from the surface of the conductive fine particle by being volatilized or being melted (or being softened) by heating treatment or the like. After the organic film is removed, when the plurality of exposed conductive fine particles are densely agglutinated or grow to be one large grain, the electrical resistivity is drastically reduced. Accordingly, when heat for melting or volatilizing the organic films of the plurality of conductive fine particles is generated, writing data in the memory element can be performed, and therefore, a writing voltage value of the memory element can be reduced. Thus, writing data in the memory element becomes possible with comparatively low power, and writing data in the memory element using a wireless signal can be achieved by mounting the memory element on a chip that obtains power from the wireless signal.

In a case where data is written in the memory element using a wireless signal, a semiconductor device of the present invention includes an antenna and a power supply generating circuit in addition to the above structure.

In the above structure, by applying voltage between two terminals of the memory element, a phenomenon arises in which the plurality of conductive fine particles are agglutinated or grow to one large grain. As a result, short circuit is caused between the two terminals, so that writing data in the memory element is performed. Since the first conductive layer and the second conductive layer are formed over the same insulating film, voltage is applied in the approximately parallel direction to the surface of the insulating film.

An interval between electrodes of the first conductive layer and the second conductive layer provided over the same surface of the insulating film can be several nm to several hundreds nm depending on processing precision of formation of the electrodes. For example, when the interval between the electrodes is 35 nm or more, a mask is formed by exposing resist by EB exposure, and the conductive film is selectively etched, so that the first conductive layer and the second conductive layer may be formed.

The first conductive layer and the second conductive layer may be each formed to have side faces in a tapered shape. Another feature of this specification is a semiconductor device provided with a plurality of memory elements. Each memory element includes a first conductive layer and a second conductive layer over a same insulating surface and at least one conductive fine particle between at least a side face of the first conductive layer and a side face of the second conductive layer which is opposite to the side face of the first conductive layer. The side faces of the first conductive layer and the second conductive layer each have an angle of less than 90° with respect to the insulating surface. When the side faces each have a tapered shape, a region between two side faces opposite to each other is enlarged, and a large number of conductive fine particles can be deposited in the region.

Another feature of this specification is a semiconductor device provided with a plurality of memory elements. Each memory element includes a first conductive layer and a second conductive layer that is beside the first conductive layer with an interval "d" over a same insulating film. In addition, each memory element includes a first conductive fine particle that overlaps the first conductive layer, a second conductive fine particle that overlaps a region between the first conductive layer and the second conductive layer, and a third conductive fine particle that overlaps the second conductive layer. The interval "d" between the first conductive layer and the second conductive layer may be provided to be smaller than a grain size of the second conductive fine particle. When the interval "d" between the first conductive layer and the second conductive layer is provided to be smaller than the grain size of the second conductive fine particle, reduction in the size of the memory element can be achieved.

Even when the interval "d" between the electrodes is smaller than the grain size of the conductive fine particle as the above structure, a plurality of conductive fine particles are deposited over both terminals electrodes opposite to each other, whereby writing data in the memory element can be performed. In this case, when voltage is applied between a pair of the electrodes, one aggregate of the plurality of conductive fine particles can serve as an intermediate between the pair of electrodes that are separated from each other, so that the pair of electrodes can be short-circuited.

An aspect of the present invention to achieve the above structure is a method for manufacturing a semiconductor device. In the semiconductor device, a first conductive layer and a second conductive layer that is deposited with an electrode interval "d" from the first conductive layer are formed over an insulating surface, and a layer containing a conductive fine particle is formed between a side face of the first conductive layer and a side face of a second conductive layer which is opposite to the side face of the first conductive layer.

When the first conductive layer and the second conductive layer are formed with high alignment accuracy and a small electrode interval "d", it is preferable that a conductive film be formed over an insulating surface, a mask be formed over the conductive film, and etching be selectively performed to the conductive film using the mask, whereby the first conductive layer and the second conductive layer are formed.

When the electrode interval "d" is several nm, it is preferable that resist masks be formed by a nanoimprint method, whereby the first conductive layer and the second conductive layer are formed. Further, one wiring may be partially removed by irradiation with laser light to be cut or separated, whereby a pair of electrodes may be formed.

The first conductive layer and the second conductive layer may be formed by a printing method such as an inkjet method or a dispenser method. When the first conductive layer and the second conductive layer are formed by a printing method and the layer containing a conductive fine particle is also formed by a printing method, the memory element can be manufactured without using a vacuum chamber. Therefore, the manufacturing time period can be shortened, and the manufacturing cost can be reduced.

Further, when the first conductive layer and the second conductive layer are formed before the conductive fine particle is formed, the present invention is not limited to the structure in which the first conductive layer and the second conductive layer are formed to be in contact with an upper surface of the same insulating film. A memory having a structure shown in a cross-sectional view of FIG. 11 or 12 may be employed. The memory shown in FIG. 11 has a portion where a second electrode partially overlaps a first electrode with an insulating film interposed therebetween, and conductive fine particles are provided to be in contact with the first electrode and the second electrode. The memory shown in FIG. 12 has an insulating film below a first electrode or a second electrode, and the first electrode and the second electrode are not formed to be in contact with the same upper surface of the insulating film.

Another aspect of this specification is a semiconductor device provided with a plurality of memory elements. In each memory element, a first conductive layer, a second conductive layer that is beside the first conductive layer, and a conductive fine particle of a surface which is covered with an organic film are deposited over a first insulating film. The conductive fine particle is deposited between the first conductive layer and the second conductive layer. In addition, a second insulating film is provided between the first insulating film and the first conductive layer or between the first insulating film and the second conductive layer.

The memory element including a pair of electrodes on the same surface is described in Reference 2. In Reference 2, variation of conductivity before and after application of voltage does not damage the memory element without variation of morphology, which is a noticeably different point from the present invention in which data is written using formation of aggregate of a plurality of conductive fine particles and volatilization of an organic film. Reference 2 does not refer to an antifuse ROM that causes the short circuit by application of voltage. In addition, the memory element in Reference 2 is not a memory element for the purpose of reduction in power consumption. Furthermore, the memory element in Reference 2 is not also a memory element for the purpose of writing data with low writing voltage in a short time period. Therefore, it can be said that the memory element in Reference 2 is unsuitable to be mounted in a chip or a portable information terminal.

In accordance with the present invention, a manufacturing process of a memory element can be simplified. Further, a nonvolatile memory element and a semiconductor device that has the memory element are provided, in which data can be additionally written at a time besides the manufacturing time and in which forgery and the like caused by rewriting can be prevented. Furthermore, an inexpensive semiconductor device is provided.

DETAILED DESCRIPTION OF THE INVENTION

Embodiment modes of the present invention will be described below.

Embodiment Mode 1

Figure 1A:
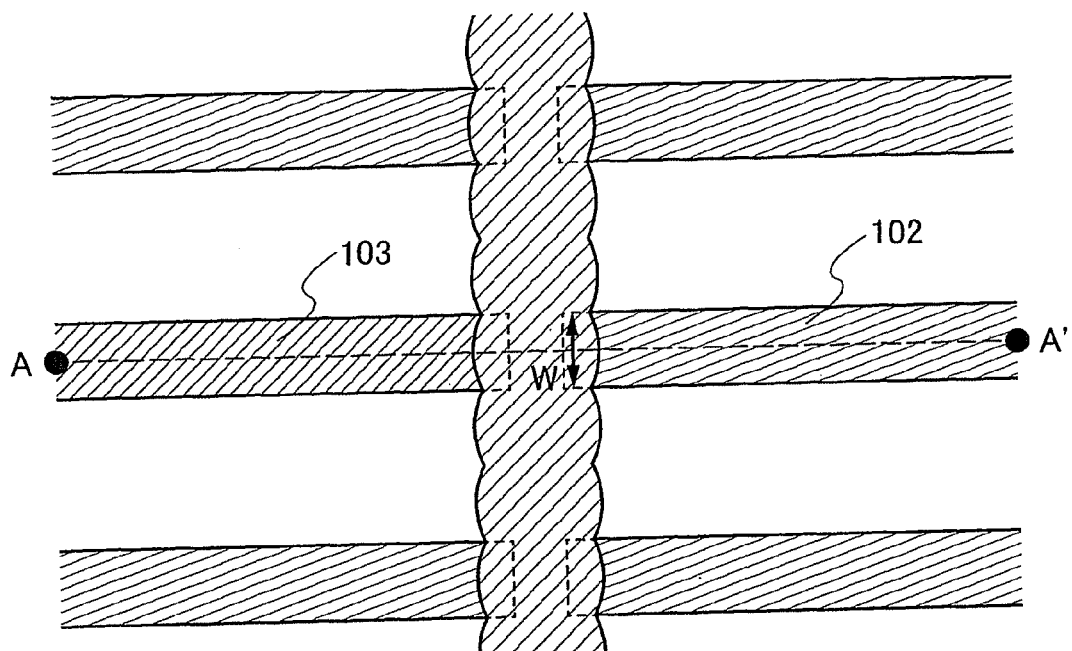
FIG. 1A is a top view of a semiconductor device.
Figure 1B:
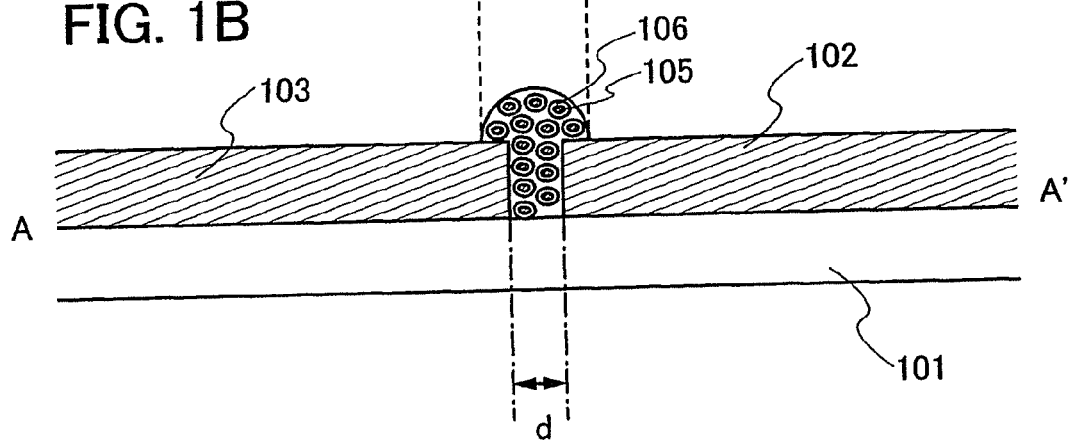
FIG. 1B is a cross-sectional view thereof.

Here, an example of a semiconductor device is shown. FIG. 1A shows a top view. FIG. 1B shows a cross-sectional view taken along a line A-A' of FIG. 1A.

In FIG. 1A, three memory elements are illustrated. Although an example of three memory elements is given here to make description simple, the number of memory elements is not particularly limited, and designers of a semiconductor device may set the number of memory elements corresponding to the desired bit number. For example, memory elements may be formed corresponding to 8 bits, 16 bits, 32 bits, 64 bits, and the like. The memory element has a structure in which a first conductive layer 102, a second conductive layer 103, and a layer 104 containing conductive fine particles deposited therebetween over a substrate 101 having an insulating surface are included as shown in FIG. 1B.

FIG. 1A shows an example in which a linear pattern of the layer 104 containing conductive fine particles is obtained by dropping of plural drops by a droplet discharge device and scanning of the drops in one direction. Therefore, circumference of the layer 104 containing conductive fine particles in FIG. 1A has an unevenness shape. The layer 104 containing conductive fine particles has a wider width than an electrode interval "d" and partially overlaps the first conductive layer 102 and the second conductive layer 103. Further, the layer 104 containing conductive fine particles are not limited to a shape in the top face of FIG. 1A. The conductive fine particles are deposited at least between a side face of the first conductive layer 102 and a side face of the second conductive layer 103 which is opposite to the side face of the first conductive layer 102.

The layer 104 containing conductive fine particles has a pattern shape which is extended through the three memory elements. Each interval between the adjacent memory elements is preferably wider than the electrode interval "d". Although the layer 104 containing conductive fine particles is extended through the three memory elements in FIG. 1A, it may be independently provided for each memory element.

The layer 104 containing conductive fine particles includes a plurality of conductive fine particles 105 and organic films 106 with which the conductive fine particles are each covered. FIG. 1B shows an example in which the plurality of conductive fine particles 105 have intervals therebetween and an organic material different from the organic film 106 is deposited in the intervals. However, the layer 104 containing conductive fine particles is not particularly limited to the example, and it may have a structure in which the organic material is volatilized and the adjacent organic films 106 are in contacted with each other. In the case where the organic material is volatilized and the adjacent organic films 106 are in contact with each other, unevenness is formed on the surface of the layer 104 containing conductive fine particles.

The first conductive layer 102 and the second conductive layer 103 may be formed using an element selected from Ta, W, Ti, Mo, Al, Cu, Ag, Au, In, or Zn; a single layer of an alloy material or a compound material containing an element listed above as its main component; or a stacked layer thereof. A semiconductor film typified by a polycrystalline silicon film that is doped with an impurity element such as phosphorus may be used.

Alternatively, the first conductive layer 102 and the second conductive layer 103 may be formed using different materials from each other in different steps. In order to reduce the number of manufacturing steps, the first conductive layer 102 and the second conductive layer 103 are preferably formed using the same material. In addition, when the first conductive layer 102 and the second conductive layer 103 are formed using the same material, alignment can be performed with high precision.

Further, the first conductive layer 102 and the second conductive layer 103 generate heat by applying voltage thereto. At that time, when the surfaces of the first conductive layer 102 and the second conductive layer 103 are exposed, they are oxidized, so that wiring resistance may be increased. Accordingly, a protective film with which the first conductive layer 102 and the second conductive layer 103 are covered is preferably provided. However, when a material having a certain degree of conductivity, even if the surfaces are oxidized, such as Ti or Zn is used as the material of the first conductive layer 102 and the second conductive layer 103, the protective film is not particularly necessary to be provided.

Although the shapes in the top face of the first conductive layer 102 and the second conductive layer 103 are a rectangular in FIG. 1A, they are not particularly limited. They may be a folded shape or a shape having a sharp projection. Further, in one memory element, an interval between the first conductive layer 102 and the second conductive layer 103 is not necessary to be uniform, and either or both of the shapes in the top face may be a shape to have the interval that is partially narrow. In this case, the electrode interval "d" indicates a portion of the narrowest interval. Since electric field is concentrated in the portion where the interval is partially narrowed, one large aggregate is formed after agglutination of the conductive fine particles with high density is partially generated, and writing data in the memory element can be performed with a low writing voltage value.

In the memory elements shown in FIGS. 1A and 1B, large aggregate of the plurality of conductive fine particles is formed by applying voltage between a pair of the electrodes provided with the electrode interval "d", so that the pair of electrodes are short-circuited. As a result, writing data in the memory element can be performed. When voltage is not applied to the memory element, since an organic film is provided over the surface of the conductive fine particle, a high electric resistance value between the pair of electrodes can be held. In such a manner, by drastically varying an electric resistance value of the memory element depending on whether or not voltage is applied, the memory device can be made to store two values.

Further, the memory element in which data is once written by applying voltage between the pair of electrodes does not have an electric resistance value which is a value before application of voltage. Accordingly, a memory element to be obtained can be an antifuse ROM that is short-circuited utilizing Joule heat that is generated by making current flow instantaneously due to application of voltage. Since a large amount of current can be made to flow in a short time period, the range of usable materials can be increased, for a material of the conductive fine particle and a material of the organic film with which the conductive fine particle is covered. When an Ag nanoparticle is used as the conductive fine particle, the plurality of conductive fine particles can be made to be at least one large aggregate at 150° C. to 250° C. In this case, voltage to generate heat at 150° C. to 250° C. may be applied between the pair of electrodes. When an AgNi nanoparticle is used, the plurality of conductive fine particles can be made to be one large aggregate at 250° C. to 450° C. In this case, voltage to generate heat at 250° C. to 450° C. may be applied between the pair of electrodes.

Embodiment Mode 2

Here, a semiconductor device including a passive-matrix memory element is shown. The passive-matrix memory element is provided in the vicinity of an intersection portion of a bit line and a word line. FIG. 2B shows a top view, and FIG. 2A shows a cross-sectional view taken along a line B-B' of FIG. 2B.

Figure 2A:
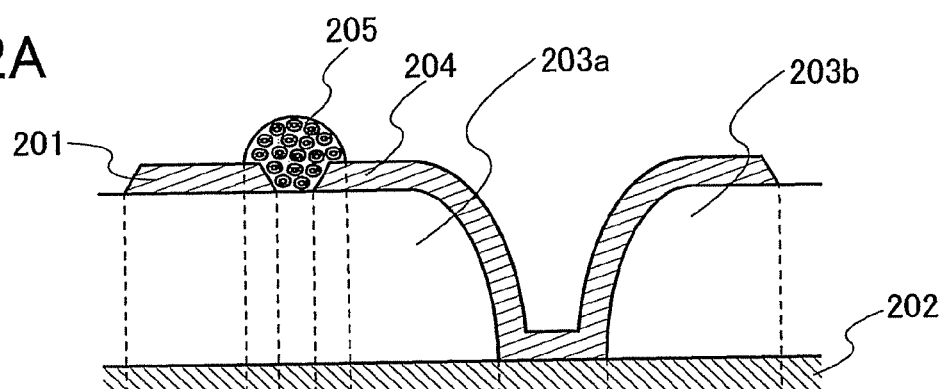
FIG. 2A is a cross-sectional view of a semiconductor device.
Figure 2B:
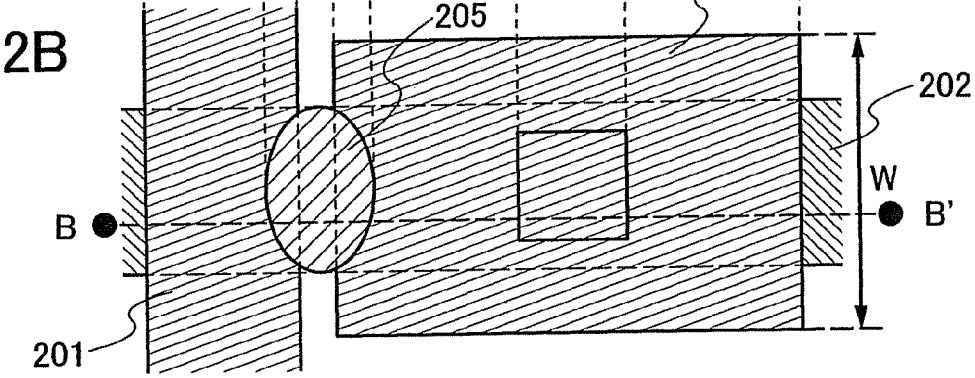
FIG. 2B is a top view thereof.

In FIG. 2A, a word line 202 is provided over a substrate having an insulating surface, and first insulating layers 203a and 203b are provided over the word line 202. The first insulating layers 203a and 203b each have a thickness of 0.8 to 1.5 μm in the vertical direction to the substrate surface. As the substrate having an insulating surface, a glass substrate, a quartz substrate, or a plastic substrate is used. As another substrate that can be used, a semiconductor substrate, an SOI substrate, a ceramic substrate, a metal substrate having an insulating film on its surface, or the like can be used.

The first insulating layers 203a and 203b are formed of the same material, in which an opening (contact hole) reaching the word line 202 is provided. A word line electrode 204 is provided to cover the opening. The word line electrode 204 that is electrically connected to the word line 202 through the opening is provided over the first insulating layers 203a and 203b. In FIG. 2A, the word line electrode 204 and a bit line 201 are provided over a same plane, in other words, over the first insulating layer 203a.

The word line 202 is a control signal line for selecting one row from a memory cell array. The memory cell array includes a plurality of memory cells that are arranged in matrix. Each memory element is arranged in the vicinity of the intersection portion of the word line 202 and the bit line 201, and writing and reading data can be possible by applying voltage of the word line corresponding to an address to which reading and writing is performed.

The bit line 201 is a signal line for taking out data from the memory cell array. The memory cell that is connected to the word line 202 to which voltage is applied performs reading data by outputting the data stored in the memory element to the bit line 201.

In addition, a layer 205 containing conductive fine particles is provided between the word line electrode 204 and the bit line 201. The layer 205 containing conductive fine particles is formed independently of each memory element arranged in the vicinity of the intersection portion of the word line 202 and the bit line 201. The layer 205 containing conductive fine particles is provided to be narrower than a width W of the word line electrode 204.

A side face of the word line electrode 204 and a side face of the bit line 201 each have a tapered shape. An electrode interval "d" is a distance between lower end portions of the side faces opposite to each other.

As shown in FIG. 2A, the layer 205 containing conductive fine particles is in contact with one side face (side face in a tapered shape) of the word line electrode 204. In addition, the layer 205 containing conductive fine particles is also in contact with the side face of the bit line 201, which is opposite to the side face of the word line electrode 204 in contact with the layer 205 containing conductive fine particles.

In order to reduce the number of steps, the word line electrode 204 and the bit line 201 are preferably formed in a same step. In order to control the interval "d" between the word line electrode 204 and the bit line 201 precisely, the word line electrode 204 and the bit line 201 are preferably formed by patterning using a same photo mask. By narrowing the interval "d" between the word line electrode 204 and the bit line 201, writing data at low voltage can be performed. In other words, writing data at low power consumption can be performed.

The word line 202, the bit line 201, and the word line electrode 204 are formed by an evaporation method, a sputtering method, a CVD method, a printing method, an electrolytic plating method, a nonelectrolytic plating method, a droplet discharge method, or the like.

In a case where the conductive fine particles contained in the layer 205 are each covered with a thin organic film and the organic film is volatilized or melted at a relatively low temperature, it is useful in the process that the bit line 201 and the word line electrode 204 are formed in advance. Since the bit line 201 and the word line electrode 204 are formed before the layer 205 containing conductive fine particles is formed, there are advantages that a formation method of a wiring to be used, particularly, deposition temperature, is not limited, and various methods can be used.

Further, the word line 202, the bit line 201, and the word line electrode 204 may be formed using different materials. Formation methods of a wiring of the word line 202, the bit line 201, and the word line electrode 204 may be different from each other.

By adjusting etching conditions in patterning as appropriate, the bit line 201 and the word line electrode 204 each having a side face in a tapered shape can be formed. When the bit line 201 and the word line electrode 204 are formed in the same step, the bit line 201 and the word line electrode 204 are to be in the same tapered shape. The tapered side face means that a cross section of the side face of the electrode is inclined to the substrate surface. Each side face of the bit line 201 and the word line electrode 204 preferably has an angle of inclination of 10° or more and less than 85°, more preferably, greater than or equal to 60° and less than or equal to 80° to the substrate surface.

Although FIG. 2A shows an example in which the bit line 201 is provided above the word line 202, the formation order is not particularly limited, and the word line may be deposited above the bit line. When the word line is deposited above the bit line, a bit line electrode that is electrically connected to the bit line through an opening of the first insulating layers is formed, and a layer containing conductive fine particles is deposited between the bit line electrode ad the word line.

In such a manner, the passive-matrix memory element is formed, which is deposited in the vicinity of the intersection portion of the bit line and the word line, and as a result, an area that is occupied by the memory element can be reduced.

Further, this embodiment mode can be freely combined with Embodiment Mode 1.

Embodiment Mode 3

Figure 3A:
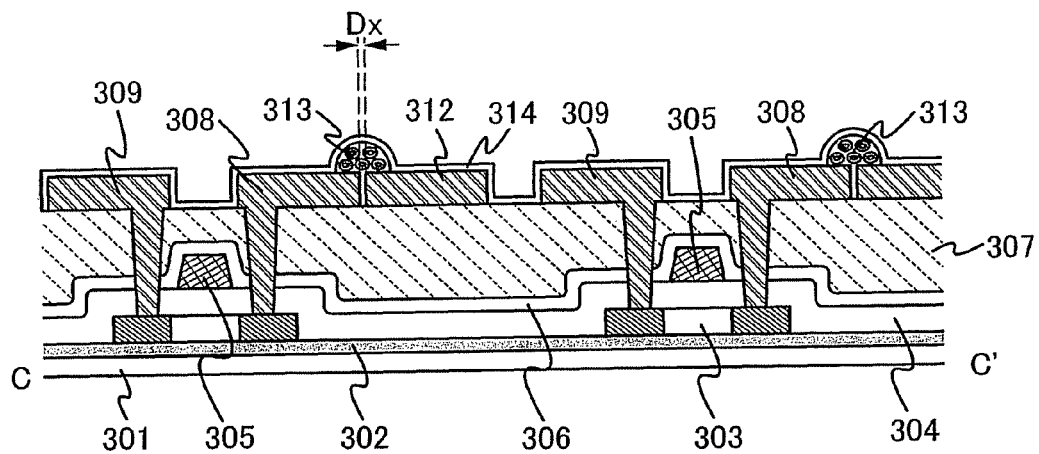
FIG. 3A is a cross-sectional view of a semiconductor device.
Figure 3B:
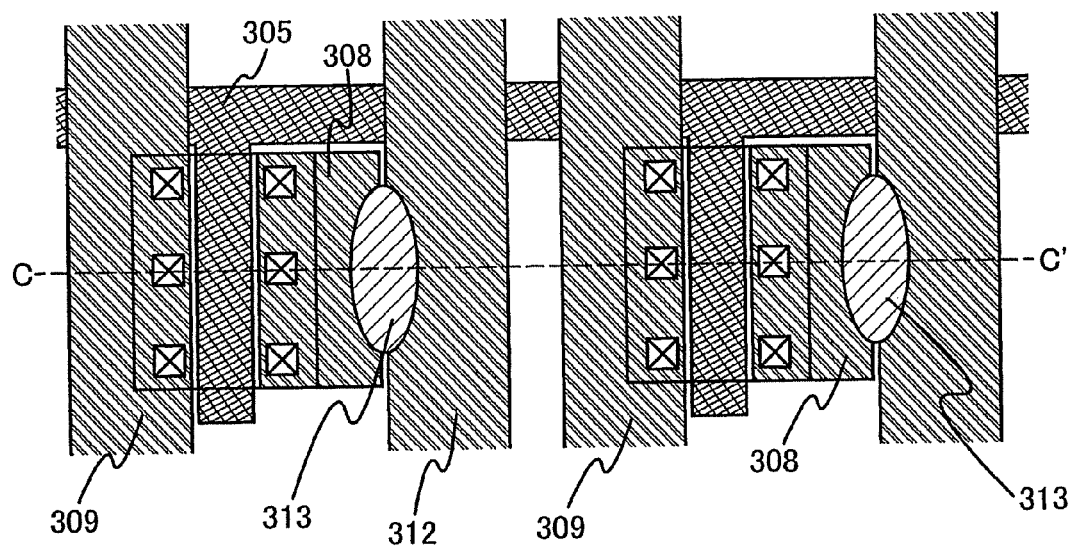
FIG. 3B is a top view thereof.

Here, an example of an active-matrix semiconductor device is shown. FIG. 3B shows a top view. FIG. 3A shows a cross-sectional view taken along a line C-C' of FIG. 3B.

In FIG. 3A, a first insulating layer 302 is provided over a substrate 301 having an insulating surface, and a semiconductor layer 303 is provided thereover. A second insulating layer 304 is provided over the first insulating layer 302 and the semiconductor layer 303, and a word line (gate line) 305 is provided over the second insulating layer 304. A third insulating layer 306 is provided over the word line (gate line) 305, and a fourth insulating layer 307 is provided thereover. A bit line 309, a first electrode 308, and a common electrode 312 are provided over the fourth insulating layer 307. The bit line 309, the first electrode 308, and the common electrode 312 are formed of a same material. Six openings (contact holes) in total, which are pairs of right and left and reach the semiconductor layer 303, are provided in the second insulating layer 304, the third insulating layer 306, and the fourth insulating layer 307. The bit line 309 and the first electrode 308 are provided to cover these openings. The bit line 309, the first electrode 308, and the common electrode 312 are provided over the same layer, that is, over the fourth insulating layer 307.

The semiconductor layer 303, the word line (gate line) 305, the first electrode 308, and the bit line 309 are included in a transistor.

In FIG. 3A, a layer 313 containing conductive fine particles is in contact with side faces of the first electrode 308 and the common electrode 312 and a part of top surfaces (upper end portion) thereof. The layer 313 containing conductive fine particles has a top face in an ellipse shape whose width is larger than at least an electrode interval Dx.

Further, FIG. 3A shows an example in which conductive fine particles contained in the layer 313 are each covered with an organic film, and a total diameter of the conductive fine particles is longer than the electrode interval Dx. Accordingly, the conductive fine particles do not exist between the side face of the first electrode 308 and the side face of the common electrode 312. A binder or a solvent are added between the side face of the first electrode 308 and the side face of the common electrode 312. Even in such a state, when voltage is applied between the first electrode 308 and the common electrode 312, heat is generated, and the organic films are melted, softened, or volatilized, so that the plurality of conductive fine particles are combined to each other to be large aggregate. Accordingly, the first electrode 308 and the common electrode 312 can be short-circuited. Further, when voltage is applied between the first electrode 308 and the common electrode 312, heat is generated, whereby the conductive fine particles are fixed to the first electrode 308. Similarly, heat is generated, whereby the conductive fine particles are fixed to the common electrode 312. In addition, even if the interval between the first electrode 308 and the common electrode 312 is a cavity, a memory element can be made to function without a problem.

Further, in the memory element shown in FIG. 3A, a protective layer 314 may be provided so as to cover the bit line 309, the first electrode 308, the common electrode 312, and the layer 313 containing conductive fine particles.

In this embodiment mode, by forming the active matrix semiconductor device, accumulation of the memory elements can be achieved. Further, low power consumption can be achieved by narrowing the electrode interval Dx.

This embodiment mode can be freely combined with Embodiment Mode 1 or Embodiment Mode 2.

Embodiment Mode 4

This embodiment mode will describe an example of steps for manufacturing a semiconductor device in which a pair of electrodes are formed by a nanoimprint method with reference to FIGS. 4A to 4D.

A mold 404 processed by an electron lithography technique, a light lithography technique using ArF laser light, or the like is prepared in advance. Carbon, glass, ceramic, metal, quartz, or the like is used as a material of the mold 404. A nanoimprint method can be roughly classified into two ways of a thermal nanoimprint method and an optical nanoimprint method. A thermal nanoimprint method is a method in which the mold is heated and pressed to a resin film, so that the surface of the resin film is processed. An optical nanoimprint method is a method in which the mold is pressed to a photo-curing resin that is not cured, and the photo-curing resin to which the mold is pressed is irradiated with light to be cured, so that the surface of the resin film is processed. Here, the mold 404 is formed using quartz (hereinafter, referred to as the quartz mold), and a method for processing a conductive film using a resin film that has two layers is described.

First, a conductive film 402 is formed over a substrate 401 having an insulating surface. The conductive film 402 is formed by an evaporation method, a sputtering method, a CVD method, a printing method, an electrolytic plating method, a nonelectrolytic plating method, a droplet discharge method, or the like.

Figure 4A:
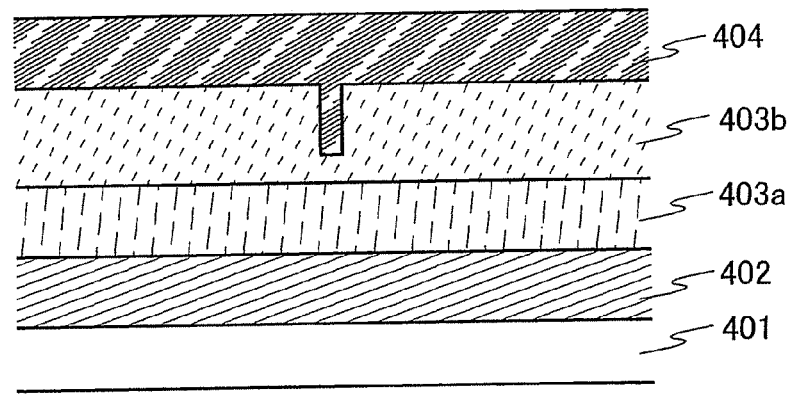
FIGS. 4A to 4D are cross-sectional views of a semiconductor device.

Next, the upper surface of the conductive film 402 is coated with a first resist 403a and baked. Then, a second resist 403b that is a photo-cure resin is applied thereto. The first resist 403a and the second resist 403b are formed of different materials from each other so that the first resist is not solved by a solvent included in the second resist. After the mold 404 is pressed to the resist film, the second resist 403b is irradiated with light through the quartz mold 404 that is a light transmitting material to be cured. A cross-sectional view of this step is shown in FIG. 4A. Through the above steps, the second resist 403b after being cured and the quartz mold 404 can be separated from each other smoothly. Further, in order to separate quartz mold 404 from the second resist 403b without breaking a shape of the second resist 403b, a film may be formed in advance by coating a surface of the quartz mold 404 with mold lubricant.

Figure 4B:
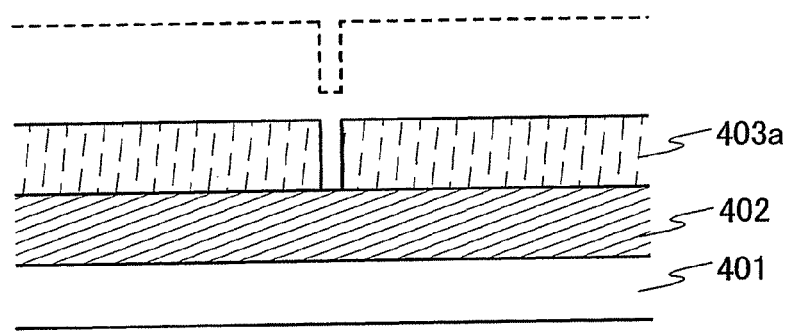

After the mold 404 is separated from the second resist 403b, etching is performed to form the first resist 403a having a shape shown in FIG. 4B.

Figure 4C:
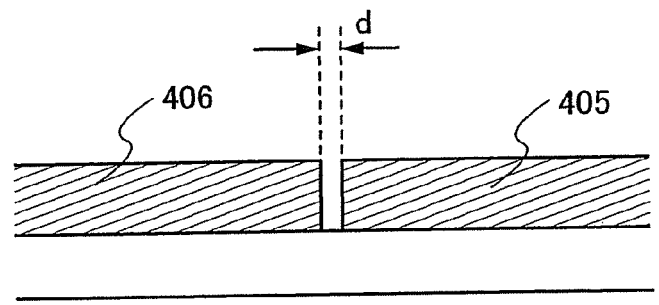

Then, the conductive film is patterned by selective etching using the first resist 403a. In such a manner, a first electrode 405 and a second electrode 406 with an electrode interval "d" therebetween can be formed over the same plan surface. A cross-sectional view of this step is shown in FIG. 4C. When a nanoimprint method is used, the electrode interval "d" can be 10 to 20 nm.

Although an example of using the resin film of two layers is shown here, it is not particularly limited. A conductive film may be processed using a resign film of one layer that is a photo-cured resin.

Figure 4D:
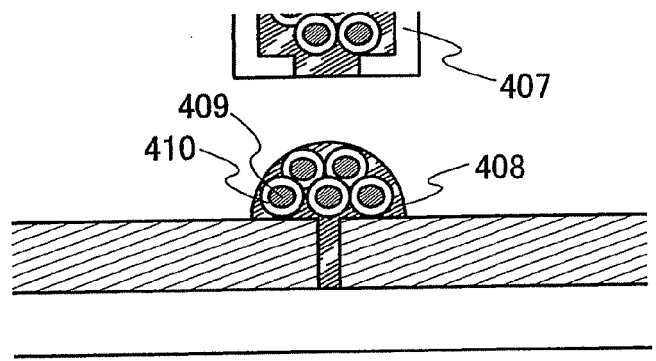

Next, a solution containing conductive fine particles 409 of each surface which is covered with an organic film 410 is prepared in advance, and the solution is selectively discharged with an inkjet device. The conductive fine particles 409 of each surface which is covered with the organic film 410 are discharged from a nozzle 407 to a portion that is overlapped with the electrode interval, so that a layer 408 containing conductive fine particles is formed. A cross-sectional view immediately after drop of the solution is shown in FIG. 4D.

The solution containing the conductive fine particles 409 of each surface which is covered with the organic film 410 can be various organic solvents, water, or mixture thereof. Further, an additive agent such as surfactant may be added to the solution containing the conductive fine particles 409 of each surface which is covered with the organic film 410.

Next, the solvent is dried. By drying, a volume of the layer 408 containing the conductive fine particles is decreased. Although a drying method is not particularly limited, a temperature in drying is less than a glass transition temperature of the organic film with which each conductive fine particle 409 is covered. Further, ultrasonic oscillation may be added before drying, whereby density of the conductive fine particles may be attempted to be uniform.

In such a manner, a memory element can be manufactured by a nanoimprint method and an inkjet method.

This embodiment mode can be freely combined with Embodiment Mode 1, Embodiment Mode 2, or Embodiment Mode 3.

The present invention comprising the above structure will be described in detail in embodiments shown below.

Embodiment 1

This embodiment will describe a structure of the passive matrix memory device shown in Embodiment Mode 2 and a method for writing data therein.

Figure 5A:
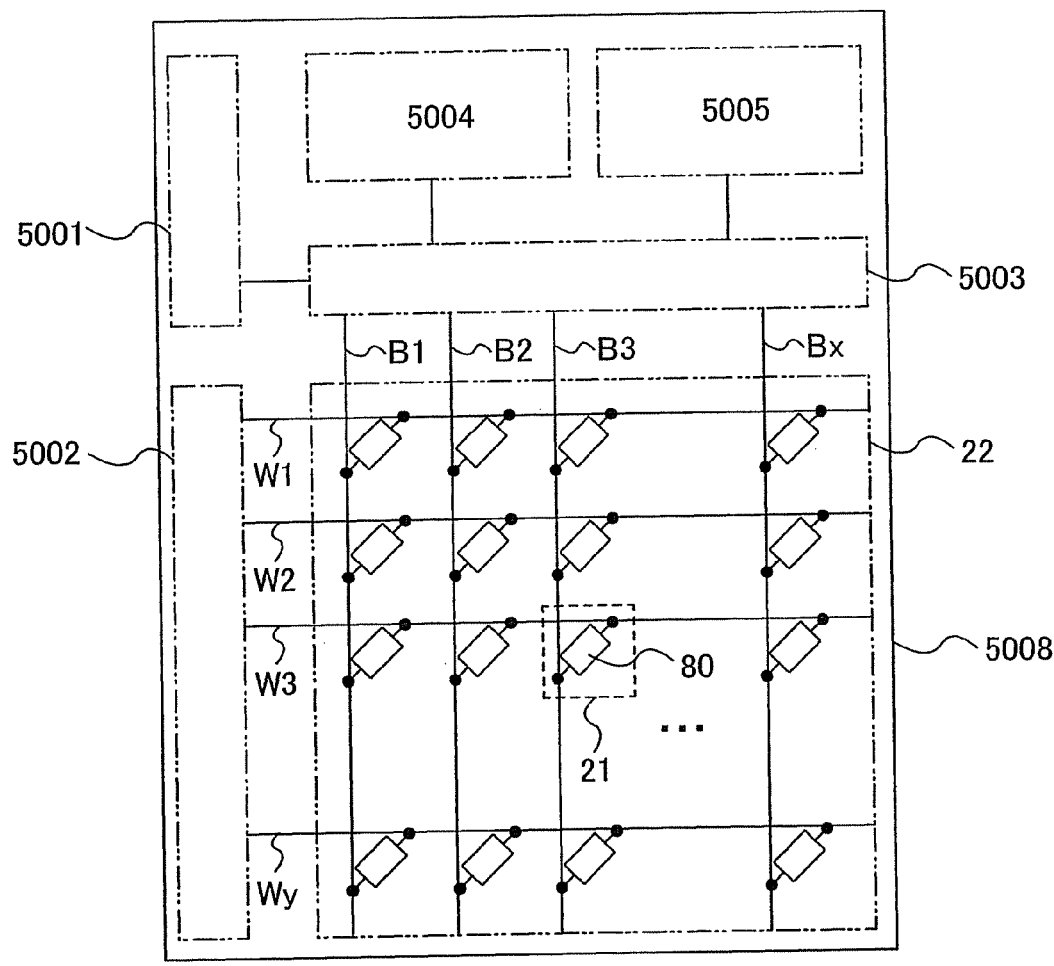
FIGS. 5A and 5B are diagrams describing a writing circuit included in a memory device of the present invention.

In FIG. 5A a word line is Wn ($1 \leq n \leq y$), and a bit line is Bm ($1 \leq m \leq x$).

FIG. 5A shows a structure of a memory device of the present invention. A memory device 5008 of the present invention has a column decoder 5001, a row decoder 5002, a reading circuit 5004, a writing circuit 5005, a selector 5003, and a memory cell array 22. The memory cell array 22 includes a plurality of memory cells 21.

Each memory cell 21 has a memory element 80.

In the present invention, a bit line (first conductive layer) and a word line electrode (second conductive layer) connected to a word line are formed over a same plane as shown in Embodiment Mode 2. The memory element 80 has a word line electrode, a bit line, and a layer containing conductive fine particles between the word line electrode and the bit line.

Note that a structure of the memory device 5008 shown here is just an example. The memory device may have another circuit such as a sense amplifier, an output circuit, or a buffer, and a writing circuit may be provided for the bit line driver circuit.

The column decoder 5001 receives an address signal to specify a column of the memory cell array, and gives a signal to the selector 5003 of the specified column. The selector 5003 receives the signal of the column decoder 5001 and selects a bit line of the specified column. The row decoder 5002 receives an address signal to specify a row of the memory cell array and selects a word line of the specified row. In accordance with the operation described above, one memory cell 21 in response to the address signals is selected. The reading circuit 5004 reads data of the selected memory cell, and amplifies and outputs the data. The writing circuit 5005 generates voltage necessary for writing, and applies the voltage to a memory element of the selected memory cell to perform writing data.

Figure 5B:
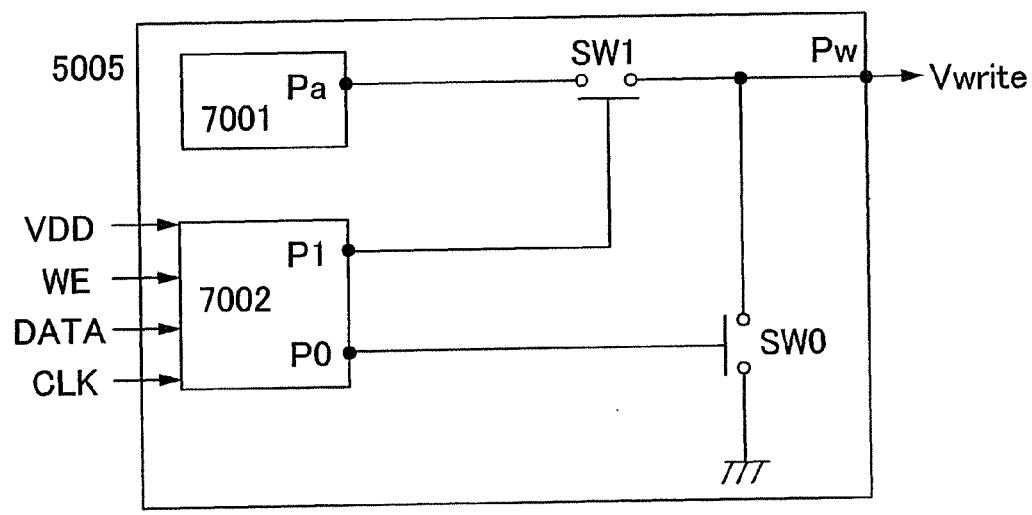

FIG. 5B shows a structure of the writing circuit 5005 of the memory device according to the present invention. The writing circuit 5005 includes a voltage generating circuit 7001, a timing control circuit 7002, switches SW0 and SW1, and an output terminal Pw. The voltage generating circuit 7001 is formed with a boosting circuit or the like and generates voltage V1 that is necessary for writing data, which is outputted from an output terminal Pa. The timing control circuit 7002 generates signals S0 and S1 controlling the switches SW0 and SW1, respectively, based on a writing control signal (referred to as WE), a data signal (referred to as DATA), a clock signal (referred to as CLK), and the like, and outputs the signals from output terminals P0 and P1, respectively. The switch SW0 controls a connection with the ground, and the SW1 controls a connection with the output terminal Pa of the voltage generating circuit 7001. Output voltage Vw from the output terminal Pw of the writing circuit can be switched by these switches.

Next, a writing operation is described, where an initial state in which conductivity of the memory element is not changed is referred to as "0" and a short-circuit state in which conductivity of the memory element is changed is referred to as "1". First, an input signal WE turns to be at a High level, the column decoder 5001 which has received an address signal to specify a column gives a signal to the selector 5003 of the specified column, and the selector 5003 connects the bit line of the specified column to the output terminal Pw of the writing circuit. The bit line which is not specified is in a non-connection (referred to as floating) state, and output voltage Vw of the writing circuit becomes V1. Similarly, the row decoder 5002, which has received an address signal to specify a row, applies voltage V2 to the word line of the specified row and 0V to the word line which is not specified. In accordance with the above-described operation, one memory element 80 in response to the address signal is selected. At this time, 0V is applied to the word line electrode.

At the same time, by receiving an input signal DATA at a High level, the voltage generating circuit 7001 can generate voltage V1 and output the voltage from the output terminal Pa. The timing control circuit 7002 can generate signals S0 and S1 controlling the switches SW0 and SW1, respectively, based on input signals WE, DATA, CLK, power supply potential (VDD), and the like, and output the signals from the output terminals P0 and P1, respectively. By the above signals, the switches SW0 and SW1 are switched, and the writing circuit 5005 can output voltage V1 as the output voltage Vw from the output terminal Pw.

In the selected memory element, by the operation as described above, voltage V2 is applied to the word line, the voltage V1 is applied to the bit line, and 0V is applied to the word line electrode. Then, the layer containing conductive fine particles is made conductive, and the voltage V1 of the bit line is applied to the bit line (the first conductive layer) of the memory element. As a result, conductivity of the memory element is changed to be in a short-circuit state, and "1" is written.

When the input signal WE turns to be at a Low level (low voltage which disables writing), all the word lines are held at 0V, and all the bit lines (the first conductive layers) and the word line electrodes (the second conductive layers) are in a floating state. At this time, the timing control circuit 7002 generates signals of a Low level as the signals S0 and S1, which are outputted from the output terminals P0 and P1. The output terminal Pw is to be in a floating state. In accordance with the operation as described above, writing is not performed.

Next, writing of "0" is described. When writing of "0" is performed, conductivity of the memory element is not changed, and voltage is not applied to the memory element. In other words, writing of "0" can be achieved by keeping an initial state. First, when the input signal WE turns to be at a High level (high voltage which enables writing) similar to the case in which data of "1" is written, the column decoder 5001 which has received an address signal to specify a column gives a signal to the selector 5003 of the specified column, and the selector 5003 connects the bit line of the specified column to the output terminal Pw of the writing circuit. At this time, the bit line which is not specified is in a floating state. Similarly, the row decoder 5002 which has received an address signal to specify a row applies the voltage V2 to the word line of the specified row and 0V to the word line which is not specified. By the operation as described above, one memory element 80 in response to the address signal is selected. At this time, 0V is applied to the word line electrode.

At the same time, by receiving an input signal DATA at a Low level, the timing control circuit 7002 generates control signals S0 at a High level and S1 at a Low level, and outputs the control signals from the output terminals P0 and P1, respectively. By the control signals, the switch SW0 is turned on and the switch SW1 is turned off, and 0V is outputted as the output voltage Vw from the output terminal Pw.

In the selected memory element, by the operation as described above, V2 is applied to the word line, and 0V is applied to the bit line and the word line electrode. Therefore, voltage is not applied to the memory element, and conductivity is not changed, and thus, an initial state "0" is kept.

When the input signal WE turns to be at a Low level, all the word lines are held at 0V, and all the bit lines and the word line electrodes are to be in a floating state. At the same time, the timing control circuit 7002 generates the signals S0 and S1 at a Low level, which are outputted from the output terminals P0 and P1, respectively, and the output terminal Pw is in a floating state.

In such a manner, writing of "1" or "0" can be performed.

Then, reading of data is described.

Figure 6:
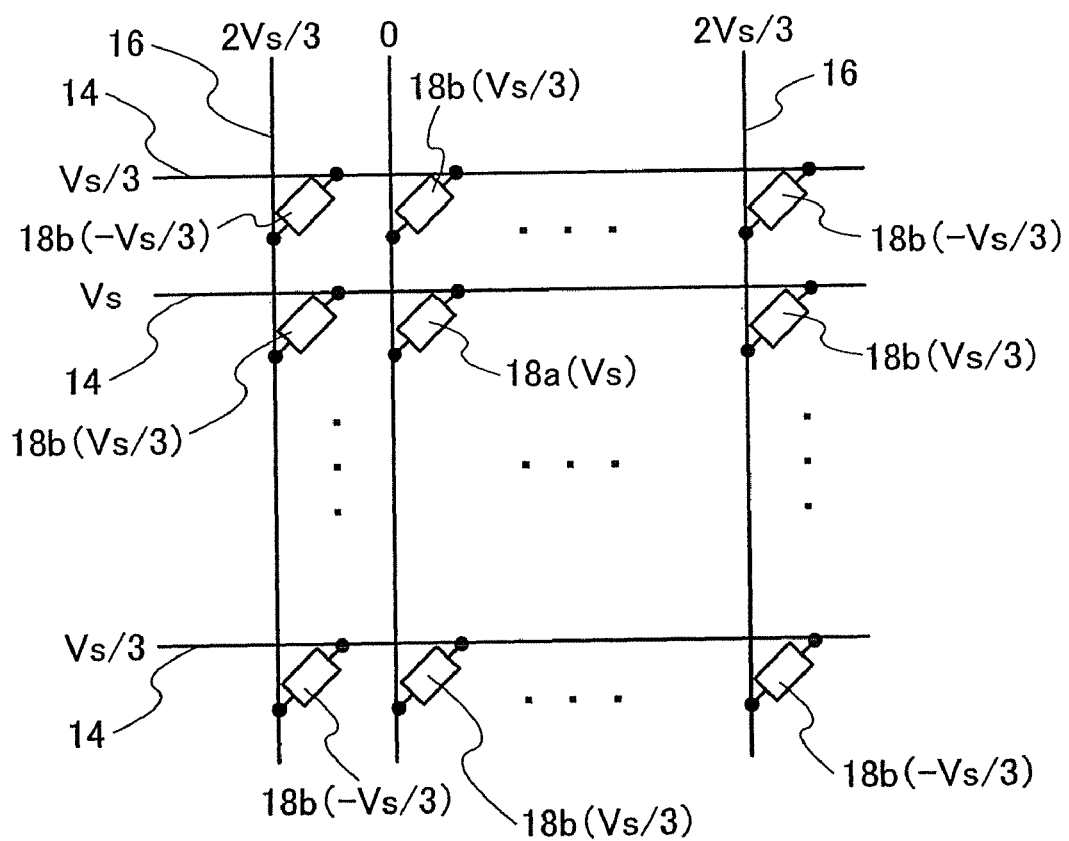
FIG. 6 is a diagram describing a reading circuit included in a memory device of the present invention.

In FIG. 6, reference numeral 14 denotes a word line, and reference numeral 16 denotes a bit line.

FIG. 6 shows one selected cell 18a and other non-selected cells 18b. The word line 14 connected to the selected cell 18a located in an address (2, 2) is set at potential Vs (word selecting potential), and the bit line 16 connected thereto is set at potential 0 (bit selecting potential). Therefore, a plus electric field of Vs−0=Vs is applied to the selected cell 18a. Accordingly, when current of the bit line 16 connected to the selected cell 18a is detected by the reading operation as described above, a state of the memory can be determined to be "1" or "0" as described above.

In addition, an actual reading operation is carried out to a plurality of memory cells of one word line 14 at the same time, and a group of data of 8-bit or 16-bit is read out at the same time.

This embodiment can be freely combined with Embodiment Mode 1, Embodiment Mode 2, or Embodiment Mode 4.

Embodiment 2

Figure 7A:
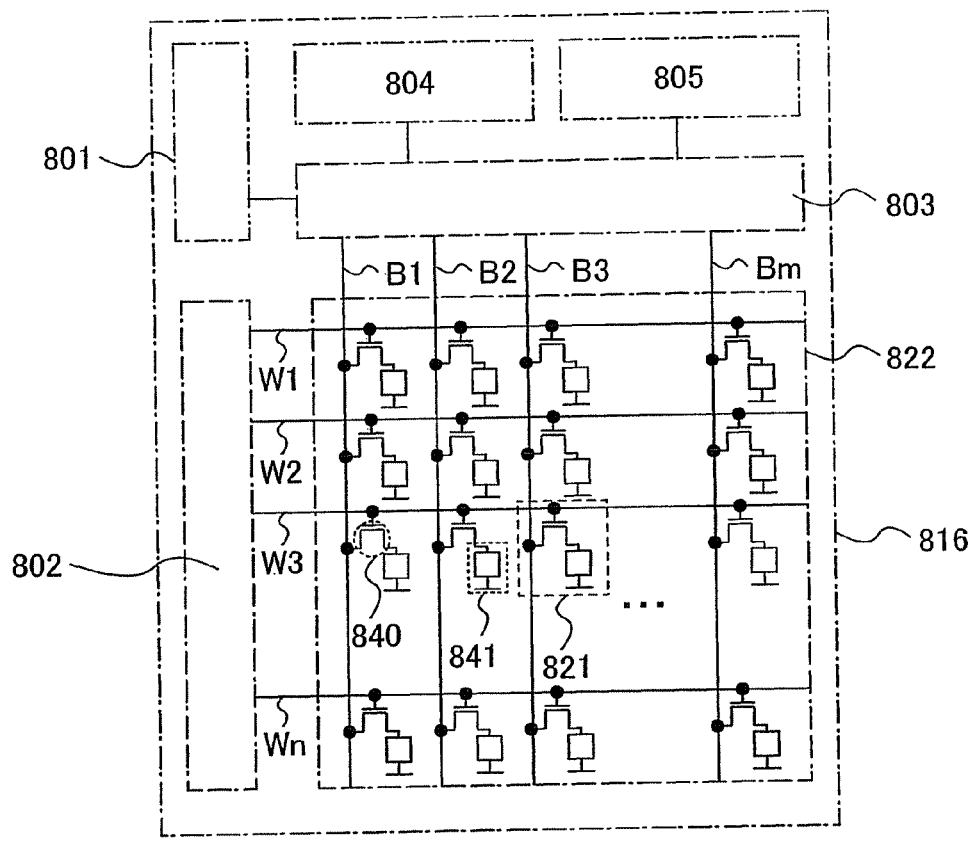
FIGS. 7A and 7B are diagrams illustrating an equivalent circuit diagram of a semiconductor device of the present invention.
Figure 7B:
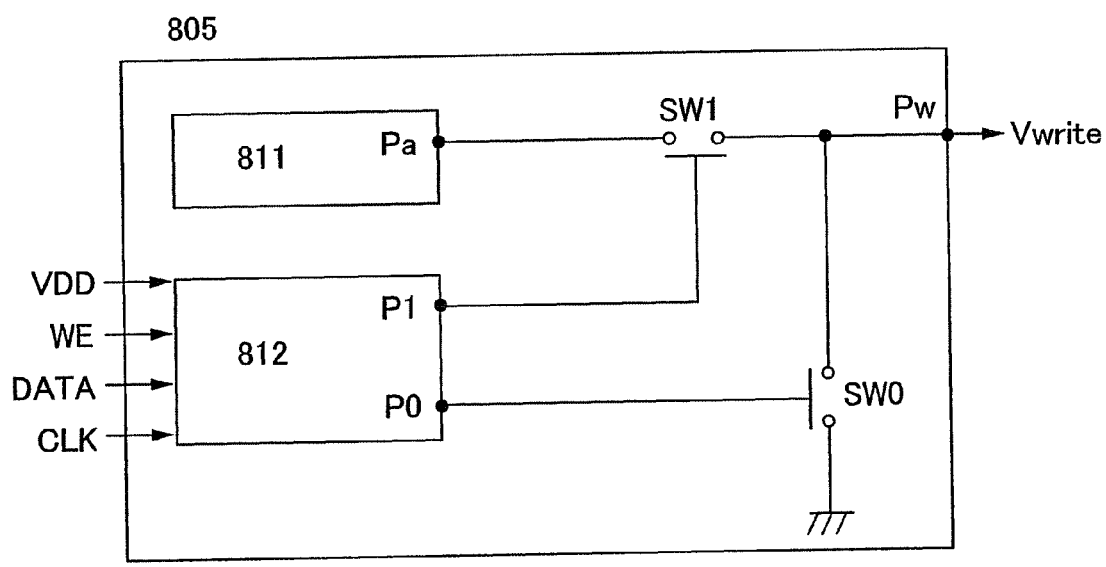

This embodiment will describe a structure of the active matrix memory device shown in Embodiment Mode 3 and a method for writing data therein using an equivalent circuit shown in FIGS. 7A and 7B.

An example of a structure of a memory device described in this embodiment has a column decoder 801, a row decoder 802, a reading circuit 804, a writing circuit 805, a selector 803, and a memory cell array 822. The memory cell array 822 includes a bit line Bm ($1 \leq m \leq x$), a word line Wn ($1 \leq n \leq y$), and x×y memory cells 821 at intersection portions of the bit line and the word line.

The memory cell 821 has a first wiring which forms a bit line Bx ($1 \leq x \leq m$), a second wiring which forms a word line Wy ($1 \leq y \leq n$), a transistor 840, and a memory element 841. The memory element 841 has a structure in which a layer containing conductive fine particles is interposed between a pair of conductive layers which are arranged in parallel, as the memory element shown in Embodiment Mode 3. Note that the structure of the memory device 816 shown here is just an example, and another circuit such as a sense amplifier, an output circuit, or a buffer may be included in the memory device, or a writing circuit may be provided for a bit line driver circuit.

The column decoder 801 receives an address signal to specify a column of the memory cell array, and gives a signal to the selector 803 of the specified column. The selector 803 receives the signal from the column decoder 801, and selects a bit line of the specified column. The row decoder 802 receives an address signal to specify a row of the memory cell array, and selects a word line of the specified row. In accordance with the operation described above, one memory cell 821 in response to the address signal is selected. The reading circuit 804 reads data stored in a memory element of the selected memory cell, and amplifies and outputs the data. The writing circuit 805 generates voltage that is necessary for writing data, and applies the voltage to a memory element of the selected memory cell to write data.

FIG. 7B shows a structure of the writing circuit 805 of the memory device according to the present invention. The writing circuit 805 includes a voltage generating circuit 811, a timing control circuit 812, switches SW0 and SW1, and an output terminal Pw. The voltage generating circuit 811 is formed with a boosting circuit or the like and generates voltage V1 that is necessary for writing data, which is outputted from an output terminal Pa. The timing control circuit 812 generates signals S0 and S1 controlling the switches SW0 and SW1, respectively, based on a writing control signal (referred to as WE), a data signal (referred to as DATA), a clock signal (referred to as CLK), and the like, and outputs the signals S0 and S1 from output terminals P0 and P1, respectively. The switch SW0 controls a connection with the ground, and the switch SW1 controls a connection with the output terminal Pa of the voltage generating circuit 811. Output voltage Vwrite from the output terminal Pw of the writing circuit can be switched whether any of these switches SW0 and SW1 is in a connection state.

Next, a writing operation is explained, where an initial state in which conductivity of the memory element is not changed is referred to as "0" and a short-circuit state in which conductivity of the memory element is changed is referred to as "1". First, when an input signal WE turns to be at a High level, the column decoder 801 which has received an address signal to specify a column gives a signal to the selector 803 of the specified column, and the selector 803 connects the bit line of the specified column to the output terminal Pw of the writing circuit. The bit line which is not specified is in a non-connection (referred to as floating) state. The output voltage Vwrite of the writing circuit is V1, and the voltage V1 is applied to the bit line of the specified column. Similarly, the row decoder 802, which has received an address signal to specify a row, applies voltage V2 to the word line of the specified row and 0V to the word line which is not specified. In accordance with the above-described operation, one memory element 841 in response to the address signal is selected. At this time, 0V is applied to a second electrode of the memory element 841.

At the same time, by receiving an input signal (DATA) at a High level, the voltage generating circuit 811 can generate voltage V1 and output the voltage V1 from the output terminal Pa. The timing control circuit 812 can generate signals S0 at a Low level and S1 at a High level controlling the switches SW0 and SW1, respectively, based on input signals WE, DATA, CLK, power supply potential (VDD), and the like, and output the signals S0 and S1 from the output terminals P0 and P1, respectively. By the above signals S0 and S1, the switch SW0 is turned off and the switch SW1 is turned on, and the writing circuit 805 can output voltage V1 as the output voltage Vwrite from the output terminal Pw.

In the selected memory element, by the operation described above, the voltage V2 is applied to the word line, the voltage V1 is applied to the bit line, and 0V is applied to the second electrode. Then, an impurity region of the thin film transistor is made conductive, and the voltage V1 of the bit line is applied to a first electrode of the memory element. As a result, conductivity of the memory element is changed to be in a short-circuit state, and "1" is written in the memory element.

When the input signal WE turns to be at a Low level (low voltage which disables writing), all the word lines are held at 0V, and all the bit lines and the second electrodes of the memory elements are to be in a floating state. At this time, the timing control circuit 812 generates signals S0 and S1 at a Low level, which are outputted from the output terminals P0 and P1. The output terminal Pw is to be in a floating state. In accordance with the operation described above, writing of "1" is terminated.

Next, writing of "0" is explained. When writing of "0" is performed, conductivity of the memory element is not changed, and voltage is not applied to the memory element. In other words, writing of "0" can be achieved by keeping an initial state. First, when the input signal WE turns to be at a High level (high voltage which enables writing) at the same time as writing of "1", the column decoder 801 which has received an address signal to specify a column gives a signal to the selector 803 of the specified column, and the selector 803 connects the bit line of the specified column to the output terminal Pw of the writing circuit 805. At this time, the bit line which is not specified is in a floating state. Similarly, the row decoder 802 which has received an address signal to specify a row applies the voltage V2 to the word line of the specified row and 0V to the word line which is not specified. By the operation described above, one memory element 841 in response to the address signal is selected. At this time, 0V is applied to the second electrode of the memory element 841.

At the same time, by receiving the input signal DATA at a Low level, the timing control circuit 812 generates control signals S0 at a High level and S1 at a Low level, and outputs the control signals S0 and S1 from the output terminals P0 and P1, respectively. By the control signals S0 and S1, the switch SW0 is turned on and the switch SW1 is turned off, and 0V is outputted as the output voltage Vwrite from the output terminal Pw.

In the selected memory element, by the operation described above, V2 is applied to the word line, and 0V is applied to the bit line and a common electrode (second electrode). Therefore, voltage is not applied to the memory element, and conductivity in the memory element is not changed, and thus, an initial state "0" is kept.

When the input signal WE turns to be at a Low level, all the word lines are held at 0V, and all the bit lines and the second electrodes are to be in a floating state. At the same time, the timing control circuit 812 generates signals S0 and S1 at a Low level, which are outputted from the output terminals P0 and P1, respectively, and the output terminal Pw is to be in a floating state. In accordance with the operation described above, writing of "0" is terminated.

In such a manner, writing of "1" or "0" can be performed and terminated.

In addition, the memory cell array 822 includes a plurality of transistors 840 each of which functions as a switching element and a plurality of memory elements 841 each of which is connected to the transistor 840 over a substrate having an insulating surface.

As shown in FIGS. 7A and 7B, the memory cell 821 includes the transistor 840 and the memory element 841. The memory element 841 is denoted by a rectangle in an attached drawing of this specification. A gate electrode of each transistor 840 is connected to the word line, one high concentration impurity region of each transistor 840 is connected to the bit line, and the other high concentration impurity region of each transistor 840 is connected to a first electrode of the memory element 841. A second electrode of the memory element is electrically connected to the second electrodes of all the memory elements in the memory cell array. When the memory device is operated, in other words, at the time of reading or writing, constant voltage is applied to all the second electrodes. Therefore, there is a case where the second electrode is referred to as a common electrode in this specification.

This embodiment can be freely combined with Embodiment Mode 2, Embodiment Mode 3, or Embodiment Mode 4.

Embodiment 3

Figure 8:
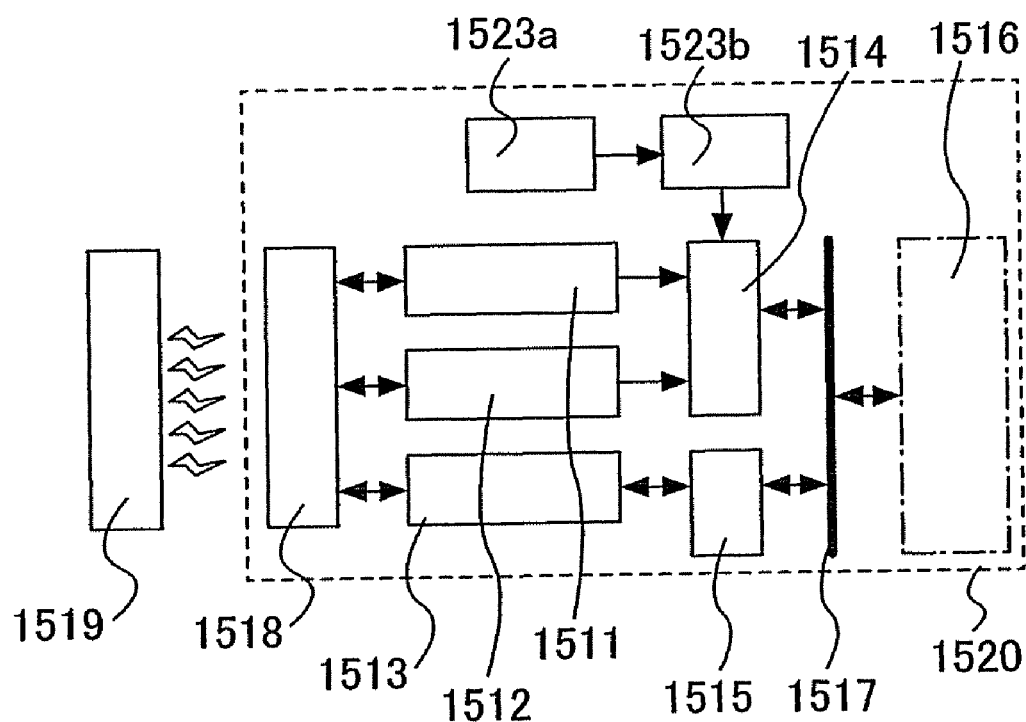
FIG. 8 is a diagram describing an exemplary structure of a semiconductor device of the present invention.

A structure of a semiconductor device will be described with reference to FIG. 8. As shown in FIG. 8, a semiconductor device 1520 according to the present invention has a function of non-contact communication of data, and includes a power supply circuit 1511, a clock generating circuit 1512, a data demodulation/modulation circuit 1513, a control circuit 1514 for controlling other circuits, an interface circuit 1515, a memory circuit 1516, a data bus 1517, an antenna (antenna coil) 1518, a sensor 1523a, and a sensor circuit 1523b.

The power supply circuit 1511 generates various kinds of power supply voltage to be supplied to each circuit inside the semiconductor device 1520, based on an AC signal inputted from the antenna 1518. The clock generating circuit 1512 generates various kinds of clock signals to be supplied to each circuit inside the semiconductor device 1520, based on the AC signal inputted from the antenna 1518. The data demodulation/modulation circuit 1513 has a function of demodulating/modulating data communicated with a reader/writer 1519. The control circuit 1514 has a function of controlling the memory circuit 1516. The antenna 1518 has a function of transmitting/receiving an electric wave. The reader/writer 1519 communicates with and controls the semiconductor device, and controls processing of the data thereof. Note that the structure of the semiconductor device is not limited to the above structure, and for example, other elements such as a limiter circuit of power supply voltage and hardware dedicated to encryption processing may be added in the semiconductor device.

The memory circuit 1516 has a memory element in which a layer containing conductive fine particles is interposed between a pair of conductive layers, which is described as the memory element in Embodiment Modes 1 to 4. In this memory element, change in electric resistance is generated by electrical action from an external side. Note that the memory circuit 1516 may include only the memory element in which a layer containing conductive fine particles is interposed between a pair of conductive layers. Alternatively, the memory circuit may have a different structure. The memory circuit having a different structure corresponds to, for example, one or more selected from a DRAM, an SRAM, an FeRAM, a mask ROM, a PROM, an EPROM, an EEPROM, or a flash memory.

The sensor 1523a is formed using a semiconductor element such as a resistor element, a capacitive coupling element, an inductive coupling element, a photovoltaic element, a photoelectric conversion element, a thermal electromotive force element, a transistor, a thermistor, or a diode. The sensor circuit 1523b detects a change in impedance, reactance, inductance, voltage, or current, and performs analog/digital conversion (A/D conversion) to output a signal to the control circuit 1514.

This embodiment can be freely combined with Embodiment Modes 1 to 4, Embodiment 1, or Embodiment 2.

Embodiment 4

Figure 10A:
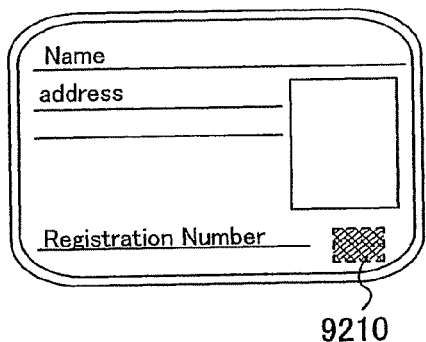
FIGS. 10A to 10F are views each describing an electronic device that includes a semiconductor device of the present invention.
Figure 10B:
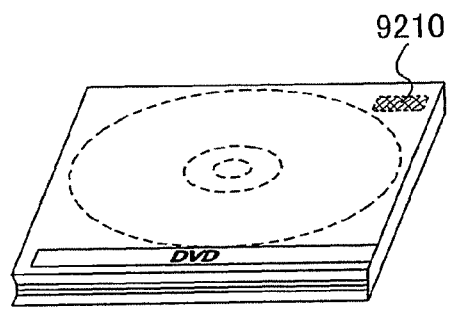
Figure 10C:
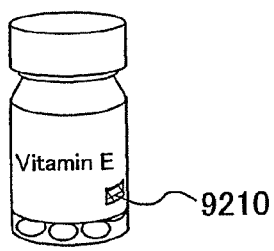
Figure 10D:
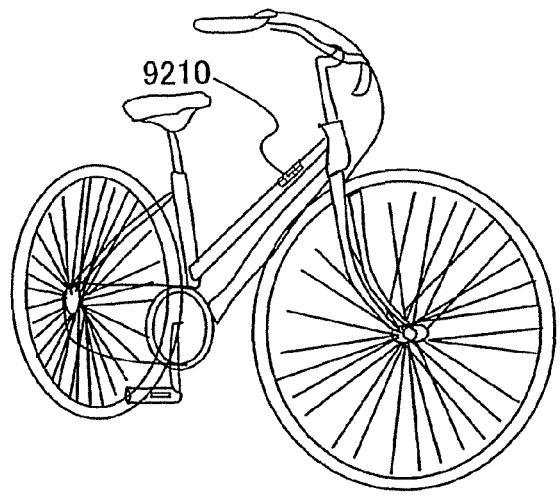
Figure 10E:
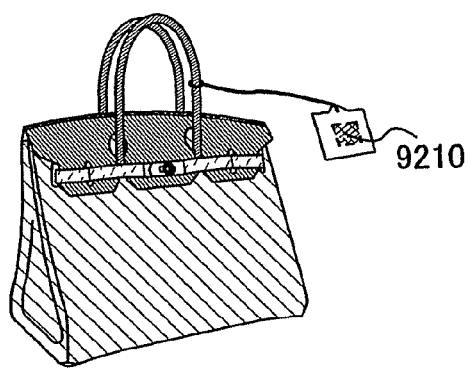
Figure 10F:
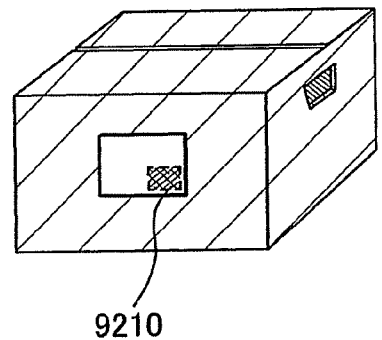

In accordance with the present invention, a semiconductor device functioning as a wireless chip can be formed. A wireless chip can be used broadly, and may be used by being mounted in objects such as bills, coins, securities, bearer bonds, certificates (driver's licenses, resident cards, and the like, refer to FIG. 10A), containers for wrapping objects (wrapping paper, bottles, and the like, refer to FIG. 10C), recording media (DVD software, video tapes, and the like, refer to FIG. 10B), vehicles (bicycles and the like, refer to FIG. 10D), personal belongings (bags, glasses, and the like), foods, plants, animals, human bodies, clothes, livingware, and products such as electronic devices, or shipping tags of baggage (refer to FIGS. 10E and 10F). The electronic device indicates a liquid crystal display device, an EL display device, a television unit (also simply referred to as a TV, a TV receiver, or a television receiver), a cellular phone, or the like.

A semiconductor device 9210 of the present invention is mounted on a printed board, attached to a surface, or incorporated to be fixed in an object. For example, the semiconductor device is incorporated in paper of a book, or an organic resin of a package to be fixed in each object. As for the semiconductor device 9210 of the present invention, downsizing, a thinner shape, and lightweight are achieved, and an attractive design of the object itself is not damaged even after fixing the semiconductor device in the object. In addition, by providing the semiconductor device 9210 of the present invention in bills, coins, securities, bearer bonds, certificates, and the like, a certification function can be obtained and forgery thereof can be prevented by making the use of the certification function. Further, by providing the semiconductor device 9210 of the present invention in containers for wrapping objects, recording media, personal belongings, foods, clothes, livingware, electronic devices, and the like, a system such as an inspection system can be more efficient.

Figure 9:
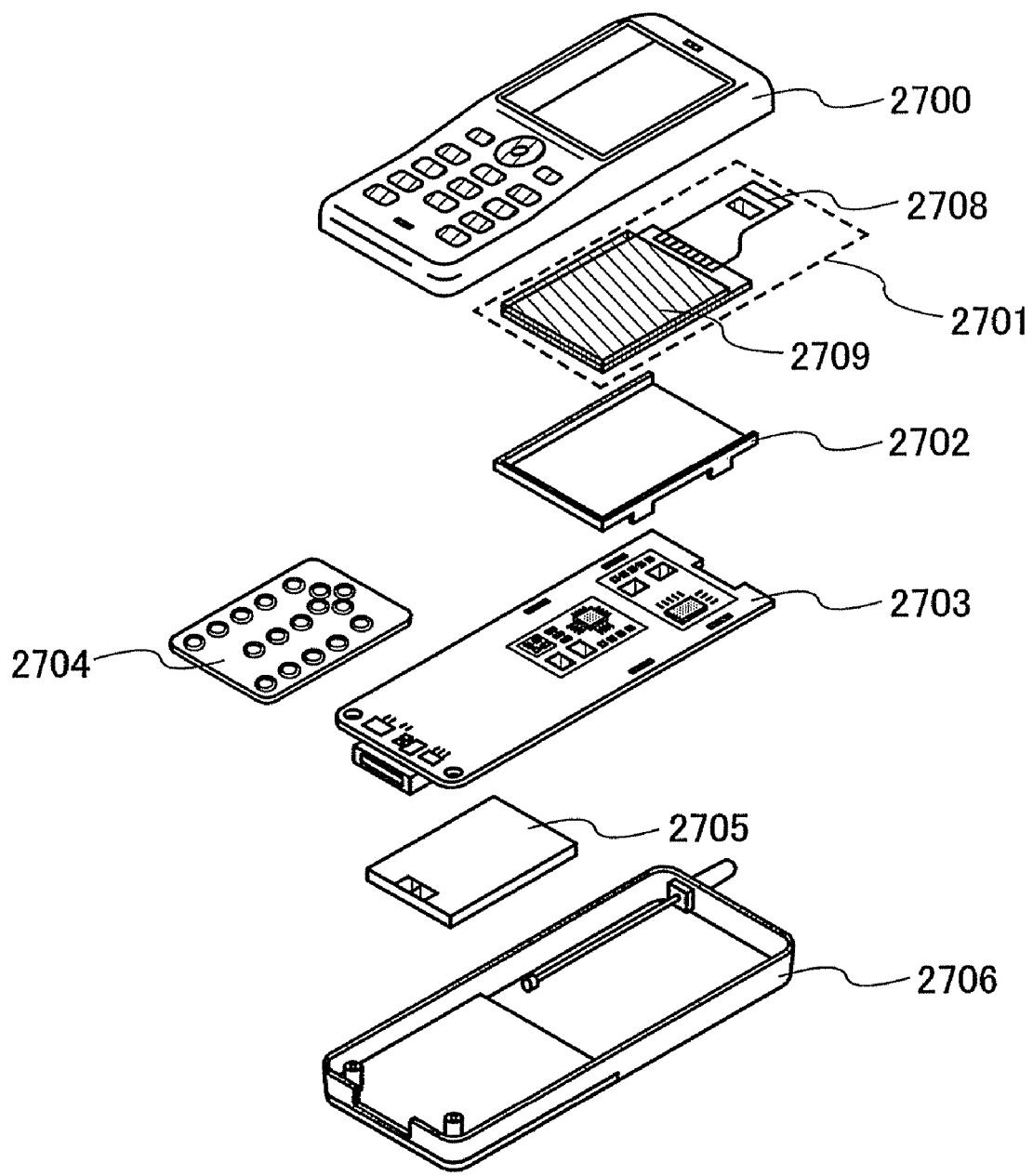
FIG. 9 is a view describing usage of a semiconductor device of the present invention.

Next, an example of an electronic device mounted with the semiconductor device of the present invention is described with reference to the drawing. The electronic device illustrated here is a cellular phone, which includes chassis 2700 and 2706, a panel 2701, a housing 2702, a printed wiring board 2703, operation buttons 2704, and a battery 2705 (refer to FIG. 9). The panel 2701 is incorporated in the housing 2702 to be detachable, and the housing 2702 is mounted on the first printed wiring board 2703. As for the housing 2702, a shape and a size thereof are changed depending on an electronic device in which the panel 2701 is incorporated as appropriate. A plurality of semiconductor devices which are packaged are mounted on the printed wiring board 2703, and as one of the semiconductor devices, the semiconductor device of the present invention can be used. Each of the plurality of semiconductor devices mounted on the printed wiring board 2703 has a function of a controller, a central processing unit (CPU), a memory, a power supply circuit, an audio processing circuit, a transmit/receive circuit, or the like.

The panel 2701 is fixed to the printed wiring board 2703 using a connection film 2708. The panel 2701, the housing 2702, and the printed wiring board 2703 are stored in the chassis 2700 and 2706 with the operation buttons 2704 and the battery 2705. A pixel region 2709 included in the panel 2701 is arranged so as to be seen through an aperture provided in the chassis 2700.

As described above, the semiconductor device of the present invention has effects of small size, thin shape, and lightweight. By these effects, a limited space inside the chassis 2700 and 2706 of the electronic device can be used efficiently.

In addition, since the semiconductor device of the present invention includes a memory element having a simple structure in which a layer containing conductive fine particles which is changed by external electric action is interposed between a pair of conductive layers, an electronic device using an inexpensive semiconductor device can be provided. Further, since the semiconductor device of the present invention can be easily highly integrated, an electronic device using a semiconductor device having a large-capacity memory circuit can be provided. As the memory element included in the semiconductor device of the present invention, the memory element shown in any one of Embodiment Modes 1 to 4 can be used.

In addition, in the memory device included in the semiconductor device of the present invention, data can be written by external electric action, and the memory device is nonvolatile in which data can be written additionally. With this feature, forgery by rewriting can be prevented, and new data can be additionally written. Therefore, an electronic device using a semiconductor device in which higher function and higher added-value are achieved can be provided.

Note that the chassis 2700 and 2706 show an appearance shape of a cellular phone as an example. The electronic device of this embodiment can be changed into various modes depending on a function or an application thereof.

This embodiment can be freely combined with any one of Embodiment Modes 1 to 4 and Embodiments 1 to 3.

Embodiment 5

Figure 11:
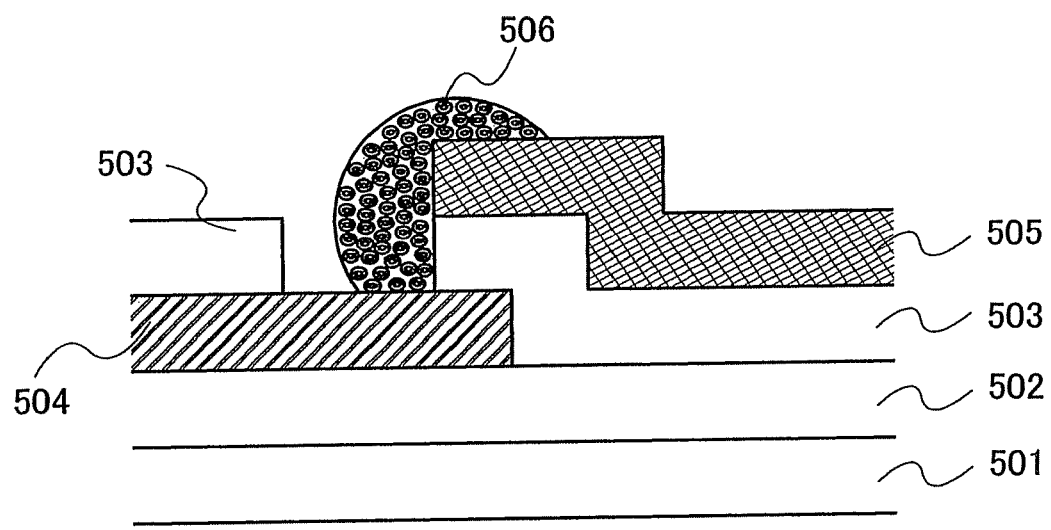
FIG. 11 is a cross-sectional view of a semiconductor device.

This embodiment will describe an example of a memory element that has a different structure from that in Embodiment Mode 1 with reference to FIG. 11. Although Embodiment Mode 1 shows the example in which a first electrode and a second electrode are formed in the same step, this embodiment shows an example in which a first electrode and a second electrode are formed in each different step.

Manufacturing procedure of a memory element shown in FIG. 11 is described below.

First, a first insulating film 502 is formed over a substrate 501 having an insulating surface. In this embodiment, a silicon substrate that is a semiconductor substrate is used.

Next, a first conductive film is formed over a first insulating film. After that, etching is selectively performed to the first conductive film, so that a first electrode 504 is formed.

Then, a second insulating film 503 to cover the first electrode 504 is formed, and a second conductive film is formed over the second insulating film. After that, etching is selectively performed to the second conductive layer, so that a second electrode 505 is formed. In this embodiment, the first electrode 504 and the second electrode 505 can be formed of different materials from each other. As each material of the first electrode 504 and the second electrode 505, an element selected from Ta, W, Ti, Mo, Al, Cu, Ag, Au, In, or Zn; a single layer of an alloy material or a compound material containing an element listed above as its main component; or a stacked layer thereof.

Next, etching is selectively performed to the second insulating film 503, so that an opening that reaches the first electrode 504 is formed.

Then, a layer containing a plurality of conductive fine particles 506 is formed by an inkjet method or the like. The layer containing a plurality of conductive fine particles 506 overlaps both the surface of the exposed first electrode 504 due to the opening and an end portion of the second electrode 505. The surface of each conductive fine particle 506 is covered with an organic film. Ag—Ni nanoparticles are used for the conductive fine particles 506.

When voltage is applied to the thus obtained memory element, each organic film with which the conductive fine particle is covered is removed, and the plurality of exposed conductive fine particles are densely agglutinated or grow to be one large grain, so that electric resistivity is drastically reduced. In the structure of FIG. 11, an interval between the first electrode 504 and the second electrode 505 is the approximately same as the thickness of the second insulating film 503.

Note that in the memory element of FIG. 11, the first electrode 504 and the second electrode 505 have an overlapped portion with the second insulating film 503 interposed therebetween; therefore, it is important to appropriately select a material of the second insulating film 503. When writing data in the memory element is performed by applying voltage to the first electrode 504 and the second electrode 505, dielectric constant or the thickness of the material of the second insulating film 503 is adjusted so as not to break the second insulating film 503 before the first electrode 504 and the second electrode 505 are electrically connected by the conductive fine particles 506.

Although FIG. 11 shows the surface of the first electrode that is partially exposed, it is not particularly limited. The first electrode may be covered with the layer containing a plurality of conductive fine particles 506 so as not to expose the surface of the first electrode. Further, the second insulating film 503 may have a side wall of the opening with a taper angle (less than 90°) with respect to a surface of the substrate. In that case, a writing voltage value of the memory element becomes higher than that in the case where the side wall of the opening is perpendicular to the substrate surface.

If the structure shown in FIG. 11 can be obtained, the manufacturing steps are not limited to the above. After the second insulating film and the second conductive film are stacked, formation of the opening in the second conductive film and formation of the second electrode are performed using the same mask, so that the number of steps may be reduced.

Although an edge face of the second electrode 505 and the opening periphery of the second insulating film 503 are aligned with each other in FIG. 11, it is not particularly limited. The edge face of the second electrode 505 may be positioned on an outer side of the opening periphery of the second insulating film 503. In addition, although the conductive fine particles 506 are extended over the second electrode 505 in FIG. 11, it is not particularly limited as long as the conductive fine particles 506 are deposited from the edge face of the second electrode to the surface of the first electrode.

This embodiment can be freely combined with any one of Embodiment Modes 1 to 4 and Embodiments 1 to 4.

Embodiment 6

Figure 12:
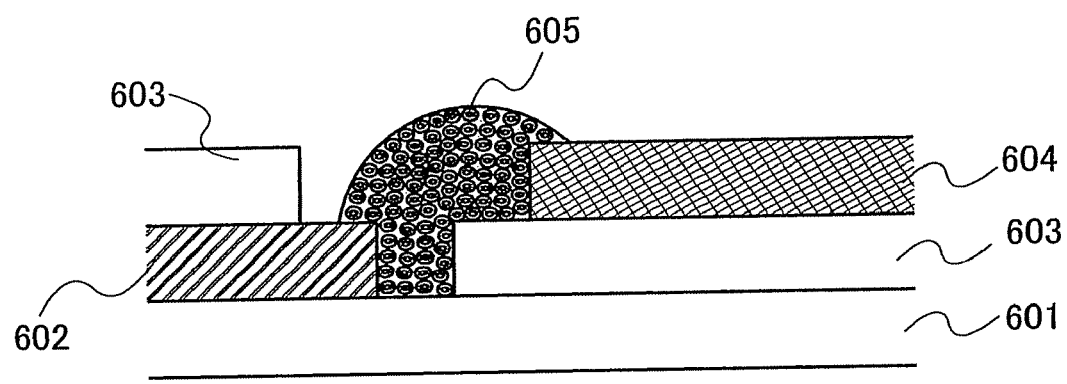
FIG. 12 is a cross-sectional view of a semiconductor device.

This embodiment will describe an example of a memory element that has a different structure from that in Embodiment Mode 1 with reference to FIG. 12. Although Embodiment Mode 1 shows the example in which a first electrode and a second electrode are formed in the same step, this embodiment shows an example in which a first electrode and a second electrode are formed in each different step.

Manufacturing procedure of the memory element shown in FIG. 12 is described below.

First, a first conductive film is formed over a substrate 601 having an insulating surface, and then etching is selectively performed to the first conductive film, so that a first electrode 602 is formed.

Next, an insulating film 603 is formed to cover the first electrode 602, and etching is selectively performed to the insulating film 603, so that an opening to expose an end portion of the first electrode 602 is formed.

Then, a second conductive film is formed over the insulating film 603. After that, etching is selectively performed to the second conductive film, so that a second electrode 604 is formed. In this case, since etching is selectively performed, materials with a large etching rate are used for materials of the first electrode and the second electrode. In this embodiment, the first electrode 602 and the second electrode 604 can be formed of different materials from each other. As each material of the first and second conductive films to be the first and second electrodes, an element selected from Ta, W, Ti, Mo, Al, Ag, Au, In, or Zn; a single layer of an alloy material or a compound material containing an element listed above as its main component; or a stacked layer thereof.

Next, a layer containing a plurality of conductive fine particles 605 is formed by an inkjet method or the like. The layer containing a plurality of conductive fine particles 605 is formed to overlap an end portion of the first electrode 602 which is exposed due to the opening and an end portion of the second electrode 604. The surface of each conductive fine particle 605 is covered with an organic film. Ag nanoparticles are used for the conductive fine particles 605.

When voltage is applied to the thus obtained memory element, each organic film with which the conductive fine particle is covered is removed, and the plurality of exposed conductive fine particles are densely agglutinated or grow to one large grain, so that electric resistivity is drastically reduced.

Although FIG. 12 shows the surface of the first electrode that is partially exposed, it is not particularly limited. The first electrode may be covered with the layer containing a plurality of conductive fine particles 605 so as not to expose the surface of the first electrode. Further, the insulating film 603 may have a side wall of the opening with a taper angle (less than 90°) with respect to the surface of the substrate. An end portion of the second electrode 604 may have a shape with a taper angle (less than 90°) with respect to the surface of the substrate. An end portion of the first electrode 602 may have a shape with a taper angle (less than 90°) with respect to the surface of the substrate.

If the structure shown in FIG. 12 can be obtained, the manufacturing steps are not limited to the above. For example, the second electrode 604 may be formed before the opening in the insulating film 603 is formed. Although the conductive fine particles 605 are extended over the second electrode 604 in FIG. 12, it is not particularly limited as long as the conductive fine particles 605 are deposited from an edge face of the second electrode to the surface of the first electrode. Further, the insulating film 603 in a portion that is overlapped with the first electrode 602 may be removed.

A depression portion is formed using the insulating film. Then, drops containing conductive fine particles may be dropped into the depression portion by a droplet discharge method. Therefore, misalignment can be reduced.

This embodiment can be freely combined with any one of Embodiment Modes 1 to 4 and Embodiments 1 to 5.

Since an antifuse ROM can be manufactured with the small number of steps, an inexpensive wireless chip and the like can be provided.

This application is based on Japanese Patent Application serial no. 2007-045558 filed with Japan Patent Office on Feb. 26, 2007, the entire contents of which are hereby incorporated by reference.

What is claimed is:

1. A memory element comprising:
   a first conductive layer over and in contact with a first region of an insulating film;
   a second conductive layer over and in contact with a second region of the insulating film; and
   a conductive particle deposited between the first conductive layer and the second conductive layer, the conductive particle having a surface covered with an organic film,
   wherein the first region is apart from the second region, and
   wherein the first and second conductive layers are electrically connectable to each other at least through the conductive particle as a result in a writing operation of the memory element.

2. A memory element according to claim 1,
   wherein the writing operation is performed by applying voltage between the first conductive layer and the second conductive layer.

3. A semiconductor device including a plurality of memory elements each of which comprises:
- a first conductive layer and a second conductive layer that is beside the first conductive layer with an interval "d";
- a first conductive fine particle that overlaps the first conductive layer,
- a second conductive fine particle interposed between the first conductive layer and the second conductive layer; and
- a third conductive fine particle that overlaps the second conductive layer,
- wherein the first conductive layer is over and in contact with an insulating film,
- wherein the second conductive layer is over and in contact with the insulating film, and
- wherein the first and second conductive layers are electrically connectable or electrically connected to each other at least through the second conductive fine particle as a result in applying voltage between the first conductive layer and the second conductive layer.

4. A semiconductor device according to claim 3, wherein the interval "d" between the first conductive layer and the second conductive layer is smaller than a grain size of the second conductive fine particle.

5. A semiconductor device according to claim 3, wherein a surface of the second conductive fine particle is covered with an organic film.

6. A semiconductor device according to claim 3, wherein the first conductive layer is a bit line, and the second conductive layer is a word line.

7. A semiconductor device according to claim 3, wherein the first conductive layer is a word line, and the second conductive layer is a bit line.

8. A semiconductor device according to claim 3, further comprising a thin film transistor, wherein the thin film transistor is electrically connected to the first conductive layer or the second conductive layer.

9. A semiconductor device according to claim 3, wherein an antenna and a power supply generating circuit are provided.

10. A semiconductor device including a memory element which comprises:
- a first conductive layer and a second conductive layer that is beside the first conductive layer with an interval "d";
- a layer including:
  - a first conductive fine particle that overlaps the first conductive layer;
  - a second conductive fine particle that overlaps a region between the first conductive layer and the second conductive layer; and
  - a third conductive fine particle that overlaps the second conductive layer,
- wherein the first conductive layer is over and in contact with an insulating film,
- wherein the second conductive layer is over and in contact with the insulating film,
- wherein the layer is in contact with a portion of the insulating film between the first conductive layer and the second conductive layer, and
- wherein the first and second conductive layers are electrically connectable or electrically connected to each other at least through the second conductive fine particle.

11. A semiconductor device according to claim 10, wherein the interval "d" between the first conductive layer and the second conductive layer is is smaller than a grain size of the second conductive fine particle.

12. A semiconductor device according to claim 10, wherein a surface of the second conductive fine particle is covered with an organic film.

13. A semiconductor device according to claim 10, wherein one of the first conductive layer and the second conductive layer is a bit line, and the other one of the first conductive layer and the second conductive layer is a word line.

14. A semiconductor device according to claim 10, wherein the first conductive fine particle contacts the first conductive layer and the third conductive find particle contacts the second conductive layer.

15. A semiconductor device according to claim 10, further comprising a thin film transistor, wherein the thin film transistor is electrically connected to one of the first conductive layer and the second conductive layer.

16. A semiconductor device according to claim 10, wherein an antenna and a power supply generating circuit are provided.

* * * * *